(12) United States Patent
Katayama et al.

(10) Patent No.: US 8,064,028 B2
(45) Date of Patent: Nov. 22, 2011

(54) METHOD FOR MANUFACTURING ELECTRO-OPTICAL DEVICE WHEREIN AN ELECTROSTATIC PROTECTION CIRCUIT IS SHIELDED BY A LIGHT-SHIELDING SHEET THAT IS SEPARATE AND APART FROM THE ELECTRO-OPTICAL DEVICE

(75) Inventors: Shigenori Katayama, Okaya (JP); Tomohide Onogi, Anpachi (JP); Kazuhiro Imao, Gifu (JP)

(73) Assignee: Sony Corporation, Tokyo (JP)

( * ) Notice: Subject to any disclaimer, the term of this patent is extended or adjusted under 35 U.S.C. 154(b) by 389 days.

(21) Appl. No.: 11/953,103

(22) Filed: Dec. 10, 2007

(65) Prior Publication Data

US 2008/0225193 A1    Sep. 18, 2008

(30) Foreign Application Priority Data

| Mar. 16, 2007 | (JP) | 2007-068076 |
| Mar. 16, 2007 | (JP) | 2007-068077 |
| Mar. 16, 2007 | (JP) | 2007-068078 |
| Mar. 16, 2007 | (JP) | 2007-068082 |
| Jul. 30, 2007 | (JP) | 2007-197022 |

(51) Int. Cl.
*G02F 1/1345* (2006.01)
*G02F 1/1333* (2006.01)

(52) U.S. Cl. ......... 349/150; 349/40

(58) Field of Classification Search ......... 349/40, 349/150
See application file for complete search history.

(56) References Cited

U.S. PATENT DOCUMENTS

| 5,712,652 A | 1/1998 | Sato et al. |
| 6,086,441 A | 7/2000 | Akiguchi et al. |
| 6,275,273 B1 * | 8/2001 | Inoue ............... 349/40 |
| 6,518,557 B1 * | 2/2003 | Izumi et al. ......... 250/208.1 |
| 6,853,370 B2 | 2/2005 | Numao |
| 7,123,229 B2 | 10/2006 | Toyozawa et al. |
| 7,256,856 B2 | 8/2007 | Imaeda |
| 2002/0021397 A1 * | 2/2002 | Suzuki et al. ......... 349/141 |
| 2002/0050958 A1 * | 5/2002 | Matthies et al. ....... 345/55 |
| 2005/0259039 A1 * | 11/2005 | Kim et al. ............. 345/60 |
| 2006/0023135 A1 * | 2/2006 | Park ................... 349/40 |
| 2006/0181500 A1 | 8/2006 | Murade |

FOREIGN PATENT DOCUMENTS

| JP | 8-286170 | 11/1996 |
| JP | 11-016502 | 1/1999 |
| JP | 2002-072915 | 3/2002 |
| JP | 2002-278498 | 9/2002 |
| JP | 2003-122331 | 4/2003 |
| JP | 2006-259684 | 9/2006 |
| WO | WO00/8625 | 2/2000 |

* cited by examiner

*Primary Examiner* — Mark Robinson
*Assistant Examiner* — Dennis Y. Kim
(74) *Attorney, Agent, or Firm* — K&L Gates LLP

(57) ABSTRACT

A method for manufacturing an electro-optical device including an element substrate which includes a plurality of pixels including pixel electrodes and which is connected to a circuit board includes providing a UV-curable molding member on the element substrate such that the molding member extends from the element substrate to the circuit board and also includes curing the molding member by irradiating the molding member with UV light. The element substrate includes an electrostatic protection circuit. The electrostatic protection circuit is shielded from the UV light applied to the molding member in the operation of curing the molding member.

10 Claims, 17 Drawing Sheets

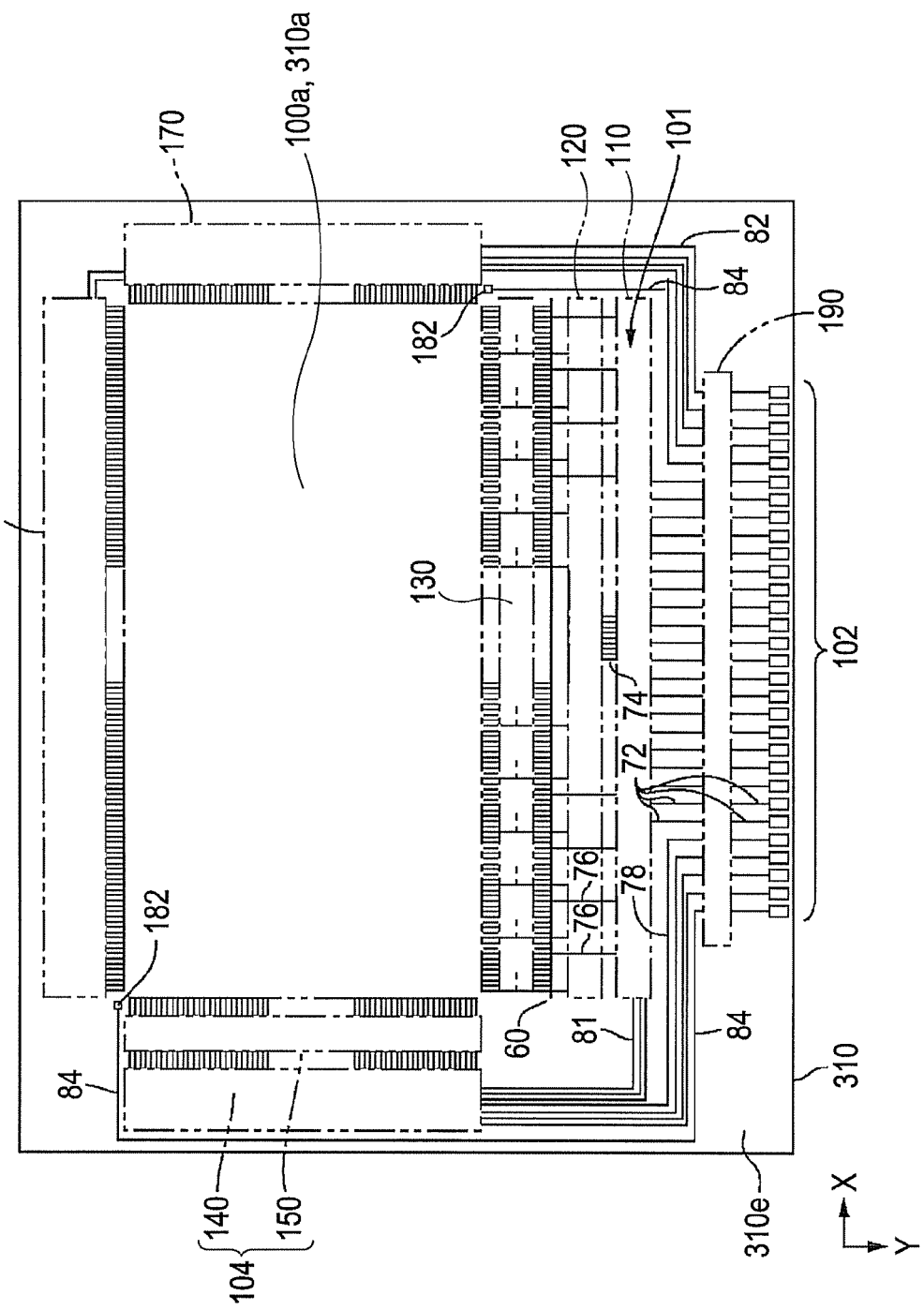

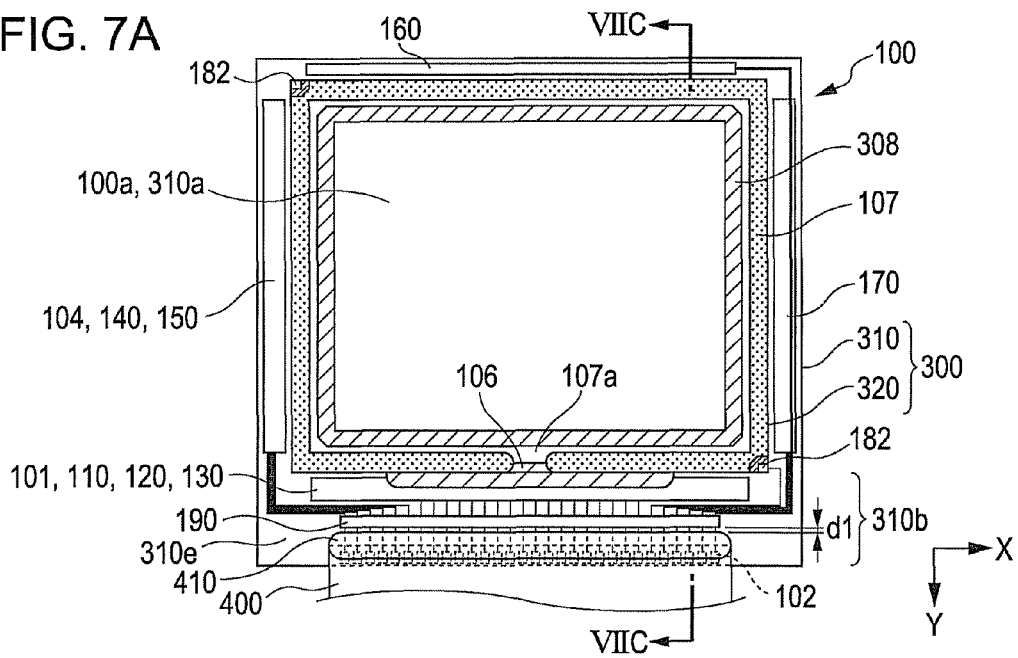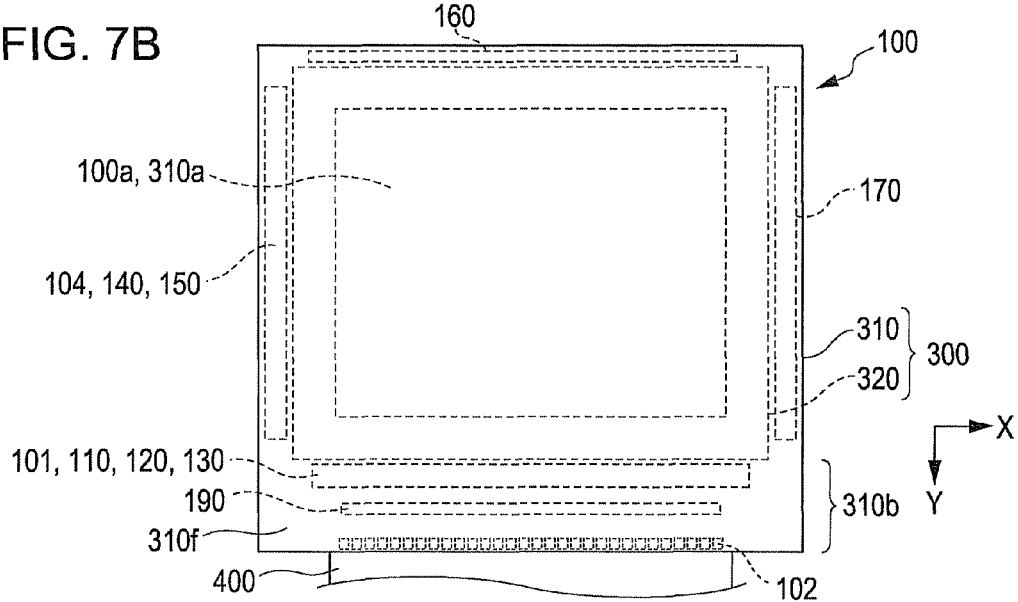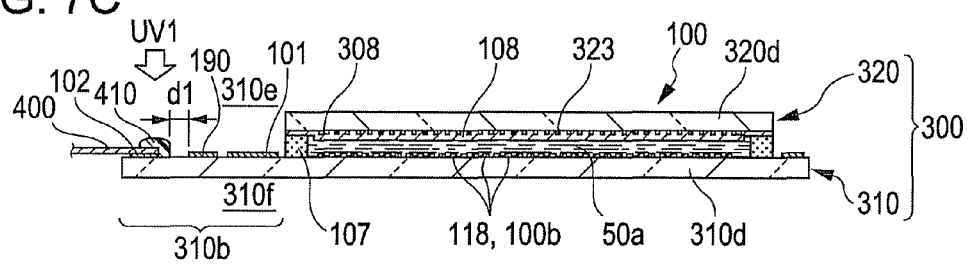

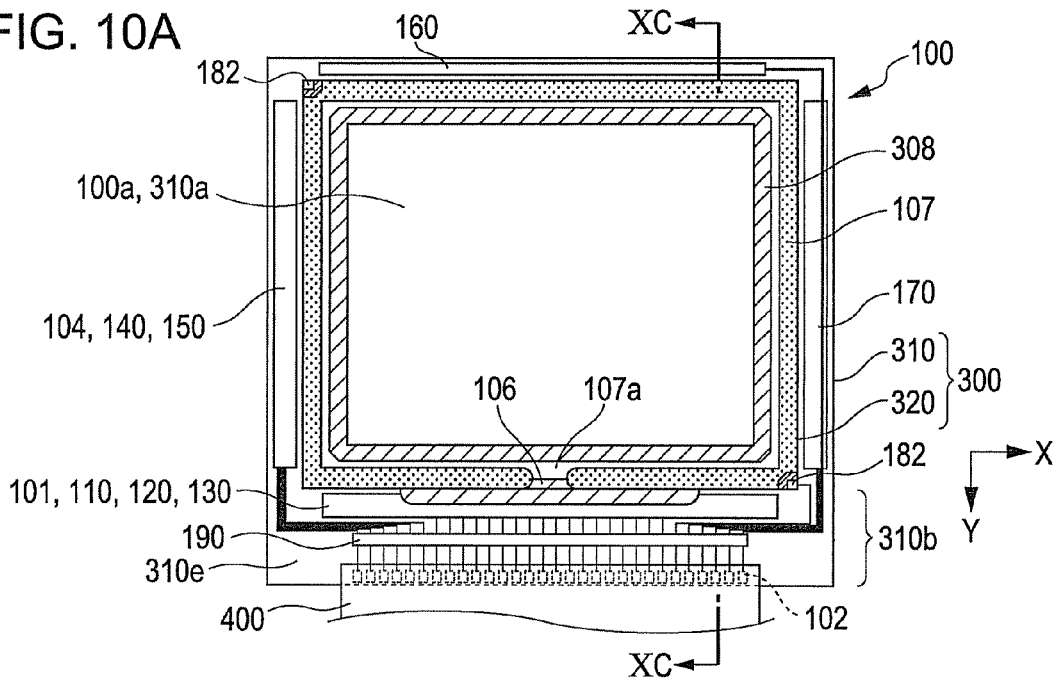
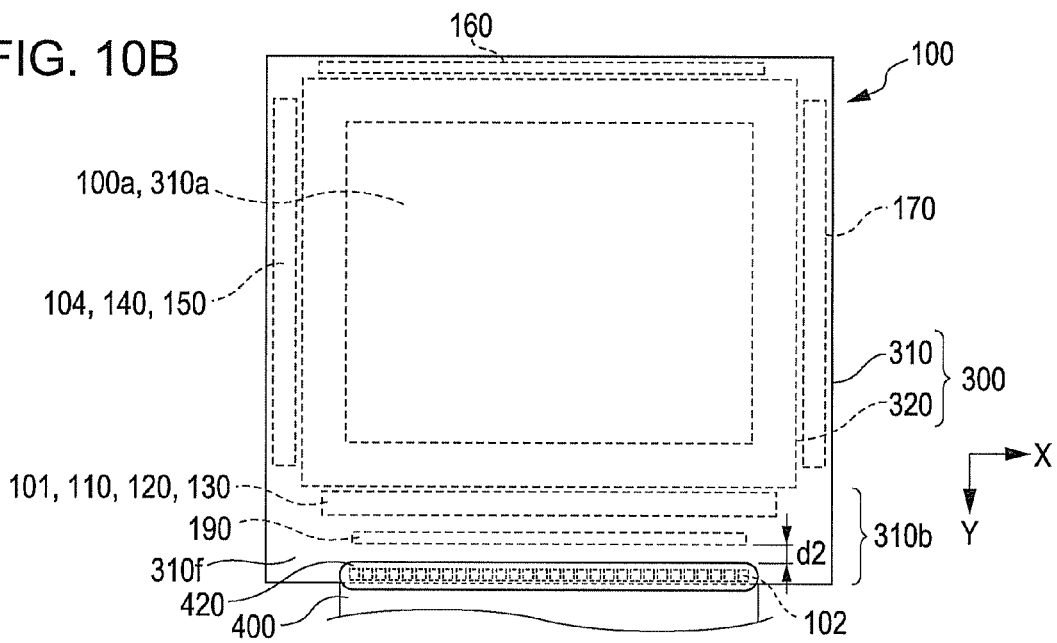
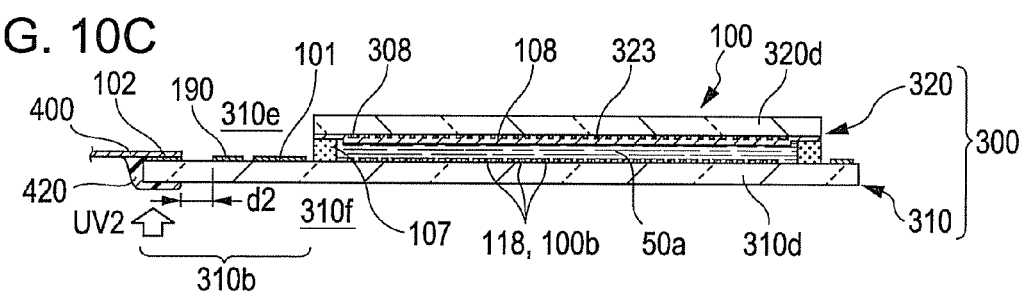

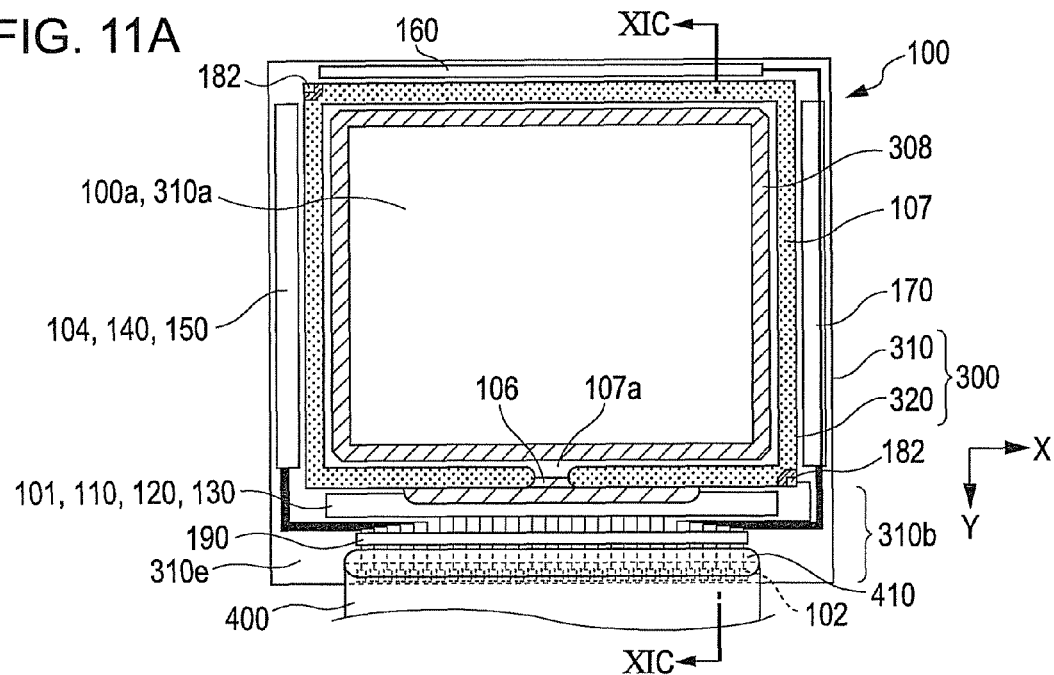
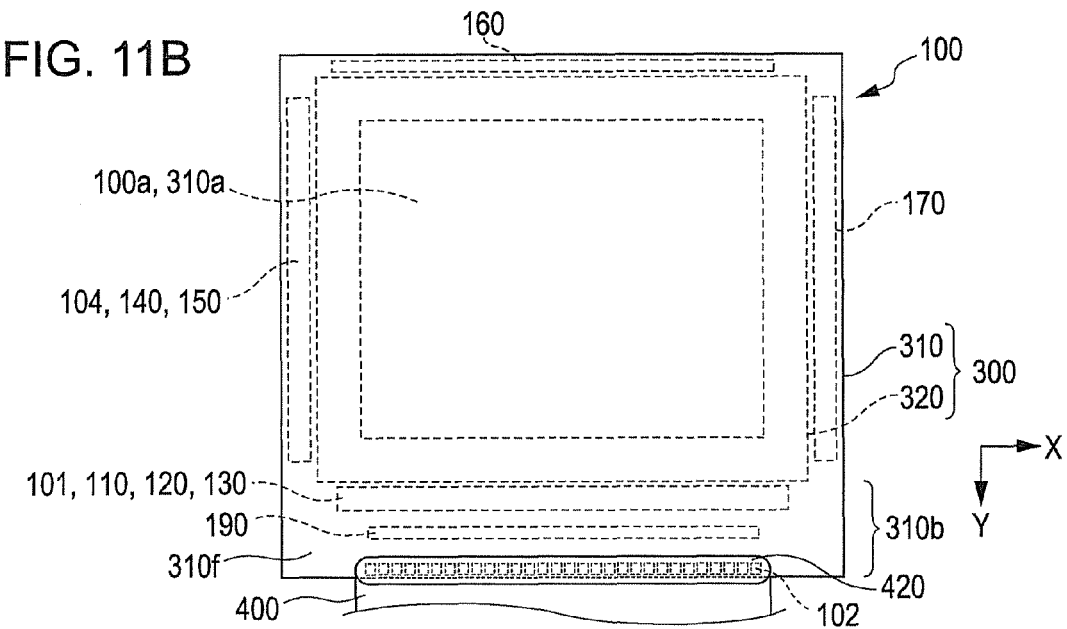
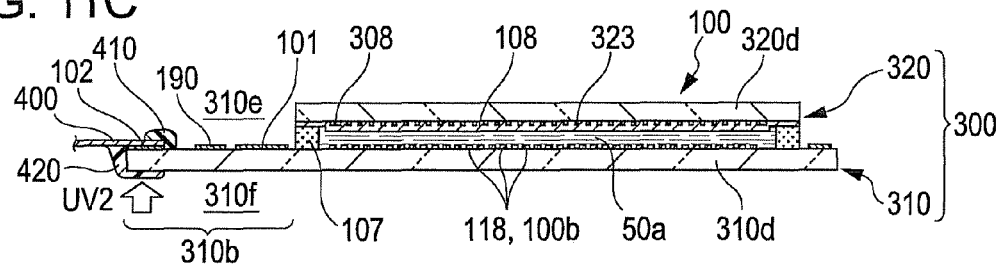

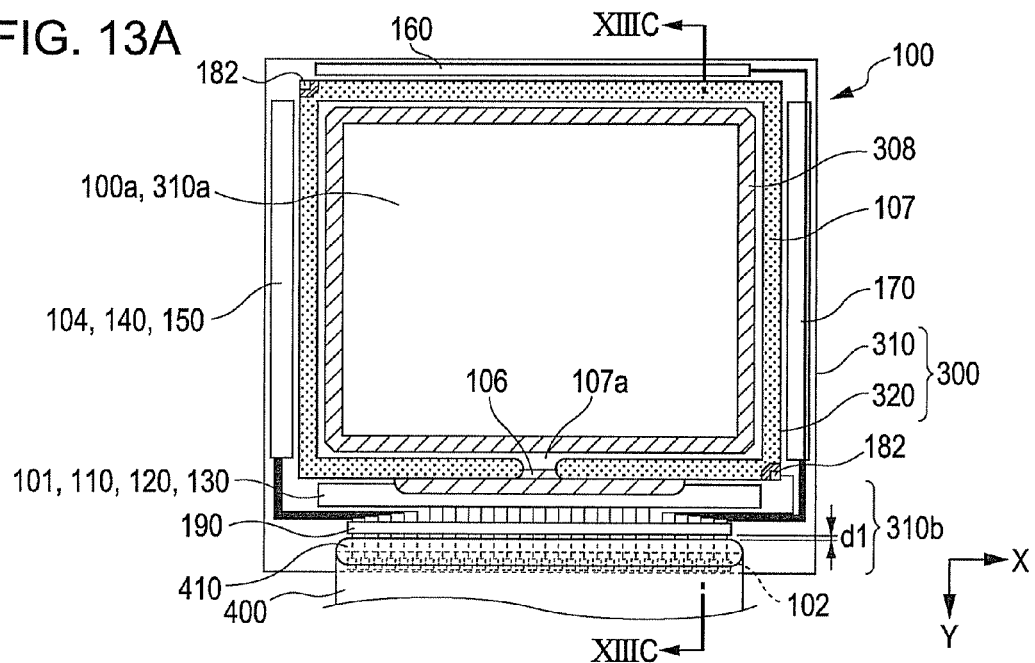
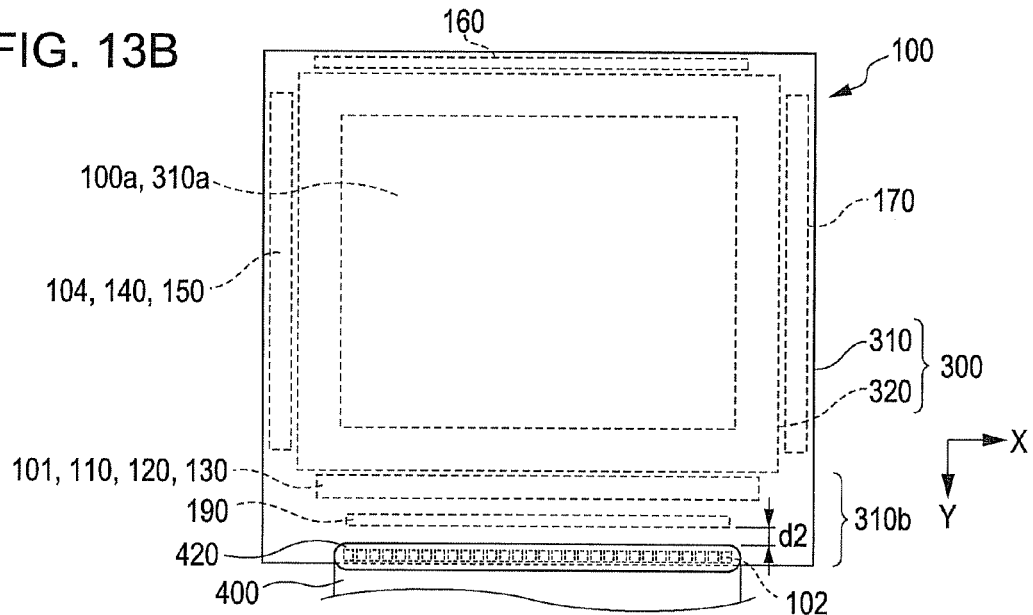
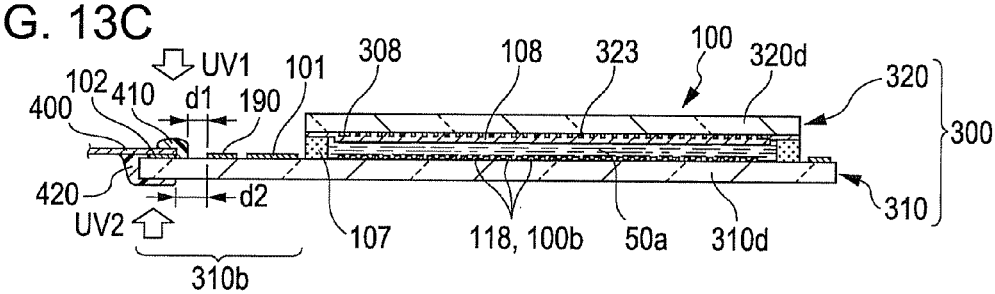

METHOD FOR MANUFACTURING ELECTRO-OPTICAL DEVICE WHEREIN AN ELECTROSTATIC PROTECTION CIRCUIT IS SHIELDED BY A LIGHT-SHIELDING SHEET THAT IS SEPARATE AND APART FROM THE ELECTRO-OPTICAL DEVICE

CROSS-REFERENCE TO RELATED APPLICATIONS

This application claims the benefit and priority of Japanese Patent Application Nos. 2007-068076, filed Mar. 16, 2007; 2007-068077, filed Mar. 16, 2007; 2007-068078, filed Mar. 16, 2007; 2007-068082, filed Mar. 16, 2007; and 2007-197022, filed Jul. 30, 2007. The entire disclosure of each of the above applications are incorporated herein by reference.

BACKGROUND

1. Technical Field

The present invention relates to an electro-optical device including an element substrate with terminals connected to an external circuit board such as a flexible printed circuit board, a method for manufacturing the electro-optical device, and an electronic apparatus including the electro-optical device.

2. Related Art

Among various electro-optical devices, a liquid crystal device includes an element substrate having a plurality of pixels including pixel electrodes; a sealing member; a counter substrate bonded to the element substrate with the sealing member; and a liquid crystal, serving as an electro-optical substance, held in a region surrounded by the sealing member. The element substrate has a first surface on which the pixel electrodes and terminals are arranged. The terminals are connected to a flexible printed circuit board. The element substrate has a second surface opposed to the first surface. The first and second surfaces of the element substrate usually each have an ultra-violet (UV) curable molding member, extending from the element substrate to the flexible printed circuit board, for protecting a connecting portion between the element substrate and the flexible printed circuit board from an external stress.

In order to use the liquid crystal device as a display for use in mobile electronic apparatuses such as mobile phones, the liquid crystal device needs to have low power consumption. The liquid crystal device refreshes to rewrite the data of each pixel for each frame without depending on a displayed image; hence, a driving circuit for driving the pixels and a control circuit for controlling the driving circuit consume electricity.

The following documents disclose a technique in which each pixel includes a static memory circuit storing one bit and is turned on or off depending on the bit stored in the memory circuit: WO 00/8625, Japanese Unexamined Patent Application Publication No. 8-286170, Japanese Unexamined Patent Application Publication No. 2002-278498, and Japanese Unexamined Patent Application Publication No. 2003-122331. In this technique, the driving circuit need not be operated because refresh is not necessary to display a still image. This leads to low power consumption.

In the liquid crystal device, elements of the driving circuit that are arranged outside a pixel region of the element substrate may be damaged by static electricity while the liquid crystal device is in-process or after the liquid crystal device is completed. In order to protect the elements, the liquid crystal device further includes an electrostatic protection circuit, adjacent to a region containing the terminals, including signal lines extending from the terminals. The electrostatic protection circuit has a configuration in which the signal lines are electrically connected to constant potential lines with diode elements disposed therebetween. In the electrostatic protection circuit, the signal lines can be insulated from the constant potential lines with the diode elements. Hence, the following problem cannot occur: a problem in that the liquid crystal device has increased power consumption.

However, the inventors have found that the liquid crystal device including the electrostatic protection circuit has a power consumption greater than that of a liquid crystal device including no electrostatic protection circuit.

The inventors have investigated why the liquid crystal device including the electrostatic protection circuit has a power consumption greater than that of the liquid crystal device including no electrostatic protection circuit. As a result, the inventors have obtained a novel finding below. In order to reinforce the connecting portion between the element substrate and the flexible printed circuit board with the UV-curable molding member, a UV-curable resin composition is provided on the connecting portion and then cured by irradiating the UV-curable resin composition with UV light. In this operation, UV light is incident on the diode elements of the electrostatic protection circuit, whereby current-voltage characteristics of the diode elements are varied. This allows micro-currents to leak from the diode elements. The micro-currents flow between the constant voltage lines and the signal lines. This leads to an increase in power consumption. Such current leakage hardly causes an increase in the power consumption of conventional liquid crystal devices each including a plurality of pixels having no memory elements. However, the leakage of the micro-currents from the diode elements leads to an increase in the power consumption of the liquid crystal device including the electrostatic protection circuit because the pixels of this liquid crystal device each include a memory element and therefore this liquid crystal device has low power consumption.

SUMMARY

An advantage of an aspect of the invention provides a method for manufacturing an electro-optical device including an element substrate which includes a plurality of pixels including pixel electrodes and which is connected to a circuit board. The method includes providing a UV-curable molding member on the element substrate such that the molding member extends from the element substrate to the circuit board and also includes curing the molding member by irradiating the molding member with UV light. The element substrate includes an electrostatic protection circuit. The electrostatic protection circuit is shielded from the UV light applied to the molding member in the operation of curing the molding member. Connection terminals are arranged on an end portion of the element substrate and are connected to the circuit board, which is flexible or rigid. The electrostatic protection circuit includes diode elements and is disposed in a region adjacent to a region containing the connection terminals.

Since the electrostatic protection circuit is shielded from UV light during the formation of the molding member, current-voltage properties of the diode elements are prevented from being varied. This prevents currents from leaking through the diode elements; hence, the presence of the electrostatic protection circuit does not lead to an increase in powder consumption.

In the element substrate, it is particularly effective that the pixels each include a memory element. Leakage currents caused by irradiating the diode elements with UV light do not cause an increase in the powder consumption of liquid crystal devices including a plurality of pixels including no memory elements but cause an increase in the powder consumption of the electro-optical device, which include the pixels including the memory elements, because the electro-optical device has low powder consumption. According to the present invention, the following object can be achieved: an object that the power consumption of the electro-optical device is reduced by providing the memory circuits in the pixels.

When the molding member is UV-curable, a UV-curable resin composition is provided over the element substrate and the circuit board, which is flexible, and then cured. In this operation, the UV-curable resin composition is irradiated with UV light in such a manner that the electrostatic protection circuit is shielded from the UV light. The electrostatic protection circuit is covered with, for example, a light-shielding member when the UV-curable resin composition is irradiated with the UV light. This prevents current-voltage properties of the diode elements from being varied because the electrostatic protection circuit is shielded from the UV light.

In the present invention, the term "light-shielding member" means one that can completely block UV light or translucent one that can partially block or attenuate UV light. Examples of a translucent light-shielding member include polarizing plates.

The UV-curable molding member is formed on at least one of a first surface or second surface of the element substrate. If the UV-curable molding member is formed on the first surface of the element substrate, the electrostatic protection circuit is shielded from the UV light applied to the first surface thereof. If the UV-curable molding member is formed on the second surface of the element substrate, the electrostatic protection circuit is shielded from the UV light applied to the second surface thereof. Furthermore, if UV-curable molding members are formed on the first and second surfaces of the element substrate, the electrostatic protection circuit is shielded from both the UV light applied to the first surface thereof and the UV light applied to the second surface thereof.

An advantage of another aspect of the invention provides an electro-optical device (hereinafter referred to as a first example) including an element substrate which includes a plurality of pixels including pixel electrodes and also includes memory elements each corresponding to one of the pixels and which has a first surface and a second surface opposed to the first surface; a circuit board connected to the first surface of the element substrate; an electrostatic protection circuit disposed on the first surface of the element substrate; and a non-UV-curable molding member which is disposed on one of the first and second surfaces and which extends from the element substrate to the circuit board. The non-UV-curable molding member is selected from the group consisting of a room-temperature-curable molding member, a heat-curable molding member, and a molding member containing a room-temperature-curable silicone resin.

An advantage of another aspect of the invention provides an electro-optical device (hereinafter referred to as a second example) including an element substrate which includes a plurality of pixels including pixel electrodes and also includes memory elements each corresponding to one of the pixels and which has a first surface and a second surface opposed to the first surface; a circuit board connected to the first surface of the element substrate; an electrostatic protection circuit disposed on the first surface of the element substrate; and a UV-curable molding member which is disposed on one of the first and second surfaces and which extends from the element substrate to the circuit board.

In the first or second example, the pixel electrodes are arranged on the first surface of the element substrate and connection terminals connected to the circuit board, which is flexible or rigid, are arranged on an end portion of the element substrate. In the element substrate, the electrostatic protection circuit includes diode elements and is disposed in a region adjacent to a region containing the connection terminals.

In the first example, the non-UV-curable molding member is used to reinforce a connecting portion between the element substrate and the circuit board. In the second example, the UV-curable molding member is disposed on one of the first and second surfaces of the element substrate and extends from the element substrate to the circuit board. In the first example, the non-UV-curable molding member need not be irradiated with UV light, current-voltage properties of the diode elements are prevented from being varied. In the second example, one of the first and second surfaces of the element substrate is irradiated with UV light; hence, UV light is incident on the diode elements of the electrostatic protection circuit once when UV light is applied to one of the first and second surfaces of the element substrate, although the electrostatic protection circuit is adjacent to the terminal-containing region. Therefore, current-voltage properties of the diode elements are not varied or are only slightly varied. This prevents currents from leaking from the diode elements; hence, the presence of the electrostatic protection circuit does not lead to an increase in powder consumption.

In the first or second example, the element substrate may include a transparent plate. However, in the second example, if the UV-curable molding member is provided on the second surface of the element substrate and the second surface thereof is irradiated with UV light, the element substrate preferably includes an opaque plate. This is because the UV light, applied to the second surface of the element substrate, for curing the UV-curable molding member cannot pass through the element substrate and therefore cannot reach the diode elements. Even if the element substrate includes the transparent plate, the amount of light incident on the diode elements is less as compared to the case where the first surface of the element substrate is irradiated with UV light or the case where the first and second surfaces of the element substrate are irradiated with UV light.

In the first or second example, the element substrate includes the memory elements, which each correspond to one of the pixels. Leakage currents caused by irradiating the diode elements do not lead to an increase in the powder consumption of electro-optical devices including no memory elements corresponding to pixels. However, the leakage of micro-currents from the diode elements leads to an increase in the powder consumption of the electro-optical device because the electro-optical device, which includes the memory elements correspond to the pixels, has low powder consumption. In the present invention, the following object can be achieved: an object that the power consumption of the electro-optical device is reduced by providing the memory elements in the pixels.

In the second example, the second surface of the element substrate need not be reinforced with any molding member and one of the first and second surfaces that has no UV-curable molding member disposed thereon may be reinforced with a member other than the UV-curable molding member.

In the second example, a non-UV-curable molding member may be provided on one of the first and second surfaces that has no UV-curable molding member disposed thereon so as to extend from the element substrate to the circuit board. The non-UV-curable molding member can be selected from the group consisting of a room-temperature-curable molding member, a heat-curable molding member, and a molding member containing a room-temperature-curable silicone resin.

An advantage of another aspect of the invention provides an electro-optical device (hereinafter referred to as a third example) including an element substrate which includes a plurality of pixels including pixel electrodes and which has a first surface and a second surface opposed to the first surface; a circuit board connected to the first surface of the element substrate; an electrostatic protection circuit disposed on the first surface of the element substrate; and a UV-curable molding member which is disposed on at least one of the first and second surfaces and which extends from the element substrate to the circuit board. The molding member is spaced from the electrostatic protection circuit at a distance of 1 mm or more in the in-plane direction of the element substrate. In the third example, the pixel electrodes are arranged on the first surface of the element substrate and connection terminals connected to the circuit board, which is flexible or rigid, are arranged on an end portion of the element substrate. The element substrate includes an electrostatic protection circuit which is disposed in a region adjacent to a region containing the connection terminals and which includes diode elements.

In the third example, the molding member is spaced from the electrostatic protection circuit at a distance of 1 mm or more in the in-plane direction of the element substrate; hence, the diode elements are prevented from being directly irradiated with UV light when the molding member is irradiated with the UV light so as to be cured. Therefore, current-voltage properties of the diode elements are not varied. This prevents currents from leaking from the diode elements; hence, the presence of the electrostatic protection circuit does not lead to an increase in powder consumption.

In the third example, the element substrate needs to include a base member that may be transparent or not. When the base member is transparent, it is particularly effective that the UV-curable molding member is disposed on the second surface of the element substrate. This is because since the molding member is spaced from the electrostatic protection circuit at a distance of 1 mm or more in the in-plane direction of the element substrate, the diode elements are prevented from being irradiated with UV light that passes through the element substrate when the UV light is applied to the molding member such that the molding member is cured.

In the third example, the molding member includes a first molding member disposed on the first surface of the element substrate and a second molding member disposed on the second surface thereof. The first and second molding members are spaced from the electrostatic protection circuit at a distance of 1 mm or more in the in-plane direction of the element substrate.

In the third example, since the first molding member is spaced from the electrostatic protection circuit at a distance of 1 mm or more in the in-plane direction of the element, the diode elements are prevented from being irradiated with UV light that is applied to one of the first and second surfaces of the element substrate such that the molding member is cured. Furthermore, since the second molding member is spaced from the electrostatic protection circuit at a distance of 1 mm or more in the in-plane direction of the element, the diode elements are prevented from being irradiated with UV light that is applied to the other one of the first and second surfaces of the element substrate such that the molding member is cured. Therefore, current-voltage properties of the diode elements are not varied. This prevents currents from leaking from the diode elements; hence, the presence of the electrostatic protection circuit does not lead to an increase in powder consumption.

In the third example, it is particularly effective that electro-optical device includes memory elements each corresponding to one of the pixels. Leakage currents caused by irradiating the diode elements with UV light do not cause an increase in the powder consumption of liquid crystal devices including a plurality of pixels including no memory elements but cause an increase in the powder consumption of the electro-optical device, which include the pixels including the memory elements, because the electro-optical device has low powder consumption. According to the present invention, the following object can be achieved: an object that the power consumption of the electro-optical device is reduced by providing the memory circuits in the pixels.

The above manufacturing method and structures according to the present invention can be applied to liquid crystal devices that each include an element substrate, a counter substrate opposed to a first surface of the element substrate, and a liquid crystal held between the element substrate and the counter substrate.

BRIEF DESCRIPTION OF THE DRAWINGS

The invention will be described with reference to the accompanying drawings, wherein like numbers reference like elements.

FIG. 4 is a plan view of an element substrate included in the electro-optical device shown in FIG. 1.

FIG. 7A is a plan view of an electro-optical device according to a second embodiment of the present invention, FIG. 7B is a bottom view of the electro-optical device according to the second embodiment, and FIG. 7C is a sectional view of the electro-optical device according to the second embodiment taken along the line VIIC-VIIC of FIG. 7A.

FIG. 10A is a plan view of an electro-optical device according to a third embodiment of the present invention, FIG. 10B is a bottom view of the electro-optical device according to the third embodiment, and FIG. 10C is a sectional view of the electro-optical device according to the third embodiment taken along the line XC-XC of FIG. 10A.

FIG. 11A is a plan view of a modification of the electro-optical device according to the third embodiment, FIG. 11B is a bottom view of this modification, and FIG. 11C is a sectional view of this modification along the line XIC-XIC of FIG. 11A.

FIG. 13A is a plan view of an electro-optical device according to a fourth embodiment of the present invention, FIG. 13B is a bottom view of the electro-optical device according to the fourth embodiment, and FIG. 13C is a sectional view of the electro-optical device according to the fourth embodiment taken along the line XIIIC-XIIIC of FIG. 13A.

DESCRIPTION OF EXEMPLARY EMBODIMENTS

Embodiments of the present invention will now be described with reference to the accompanying drawings. In the embodiments, the present invention is applied to typical electro-optical devices used as liquid crystal devices. In the accompanying drawings, in order to show layers and members on a recognizable scale, different scales are used depending on the size of the layers and members.

First Embodiment

Configuration of Electro-Optical Device

Figure 1A:
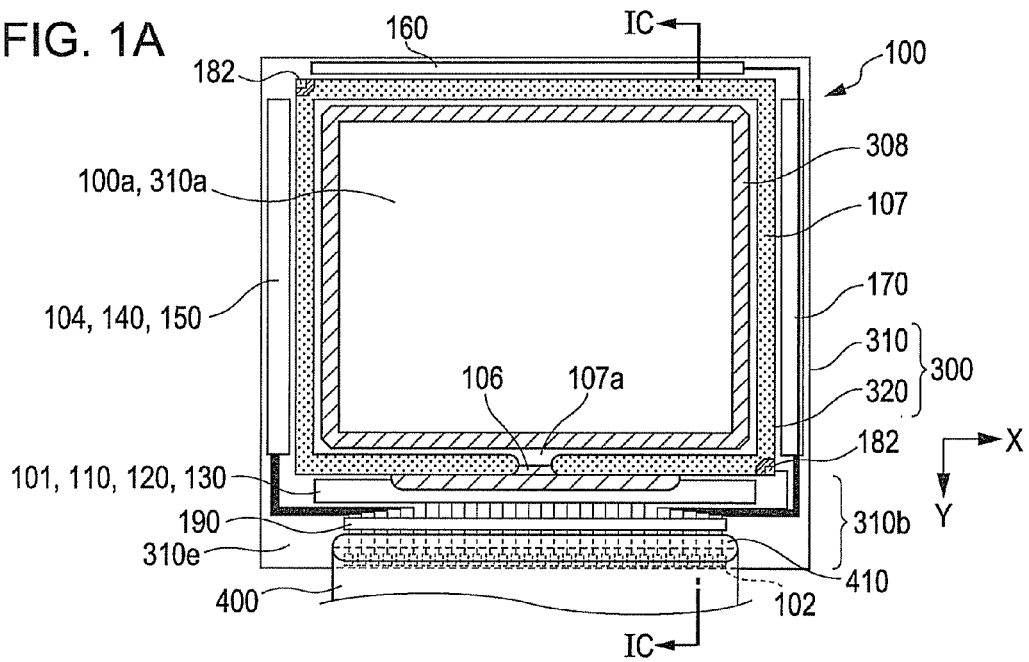
FIG. 1A is a plan view of an electro-optical device according to a first embodiment of the present invention.
Figure 1B:
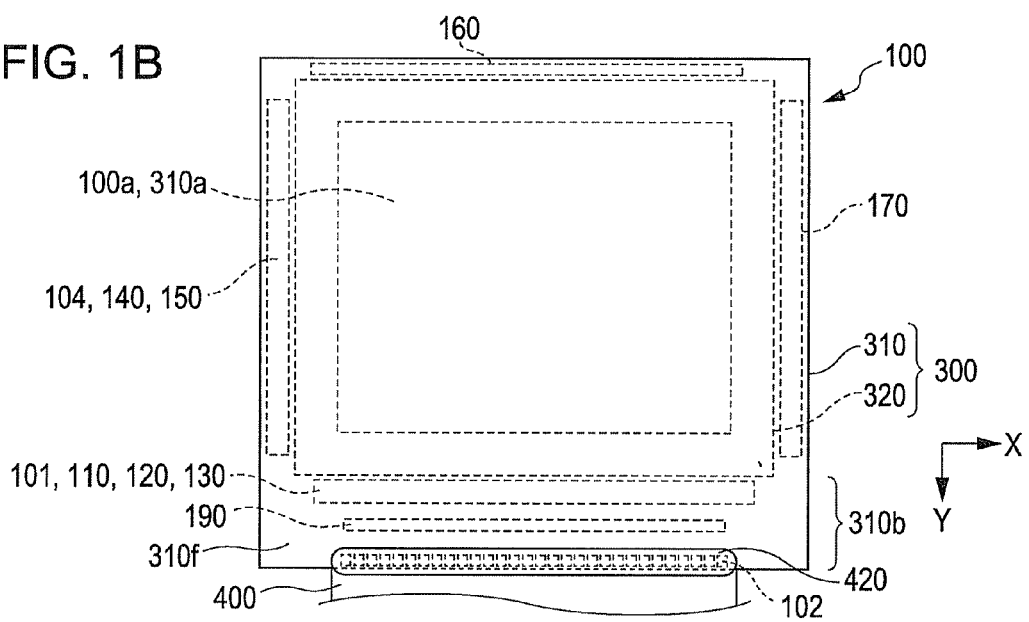
FIG. 1B is a bottom view of the electro-optical device.
Figure 1C:
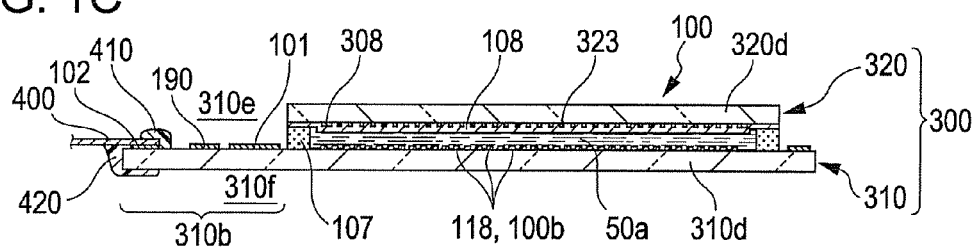
FIG. 1C is a sectional view of the electro-optical device taken along the line IC-IC of FIG. 1A.

FIG. 1A is a plan view of an electro-optical device 100 according to a first embodiment of the present invention. FIG. 1B is a bottom view of the electro-optical device 100. FIG. 1C is a sectional view of the electro-optical device 100 taken along the line IC-IC of FIG. 1A. The spatial relationships of members shown in FIG. 1B agree with those of the members shown in FIG. 1A.

With reference to FIGS. 1A to 1C, the electro-optical device 100 includes a liquid crystal panel 300. The liquid crystal panel 300 includes a sealing member 107 made of a heat- or UV-curable resin, an element substrate 310 (a first substrate), a counter substrate 320 (a second substrate) bonded to the element substrate 310 with the sealing member 107 with a predetermined space located therebetween, and a liquid crystal layer 50a which is held in a region surrounded by the sealing member 107 and which contains a twisted nematic (TN) liquid crystal 105. The sealing member 107 extends along the edge of the counter substrate 320. Both ends of the sealing member 107 form a liquid crystal inlet port 107a. The liquid crystal inlet port 107a is sealed with a sealant 106. The sealing member 107 may contain gap spacers such as glass fibers or glass beads for maintaining the distance between the element substrate 310 and the counter substrate 320 at a predetermined value.

The element substrate 310 has a pixel region 310a, located in a center area thereof, including a plurality of pixels 100b which are arranged in a matrix pattern and which each include a pixel electrode 118. The counter substrate 320 has a first light-shielding layer 308 which is referred to as a frame and which is located inside the sealing member 107 and also has an image display region 100a surrounded by the first light-shielding layer 308. The counter substrate 320 has a second light-shielding layer 323 which is referred to as a black matrix or a black stripe and which has portions opposed to the boundaries between the pixel electrodes 118. The first and second light-shielding layers 308 and 323 are made of molybdenum (Mo), tungsten (W), titanium (Ti), titanium nitride (TiN), or chromium (Cr).

In this embodiment, the electro-optical device 100 corresponds to a transmissive liquid crystal device. Therefore, the pixel electrodes 118 and a common electrode 108 are made of a transparent conductive material such as indium tin oxide (ITO). The element substrate 310 and the counter substrate 320 include a first transparent plate 310d and second transparent plate 320d, respectively, made of glass or quartz.

The element substrate 310 is larger than the counter substrate 320. The element substrate 310 has a projecting region 310b which projects out of the edge of the counter substrate 320 and which has a plurality of connection terminals 102 arranged along the edge of the element substrate 310. The element substrate 310 is connected to a flexible printed circuit board 400 with an anisotropic conductive material, with the connection terminals 102 located between the element substrate 310 and the flexible printed circuit board 400.

Figure 2A:
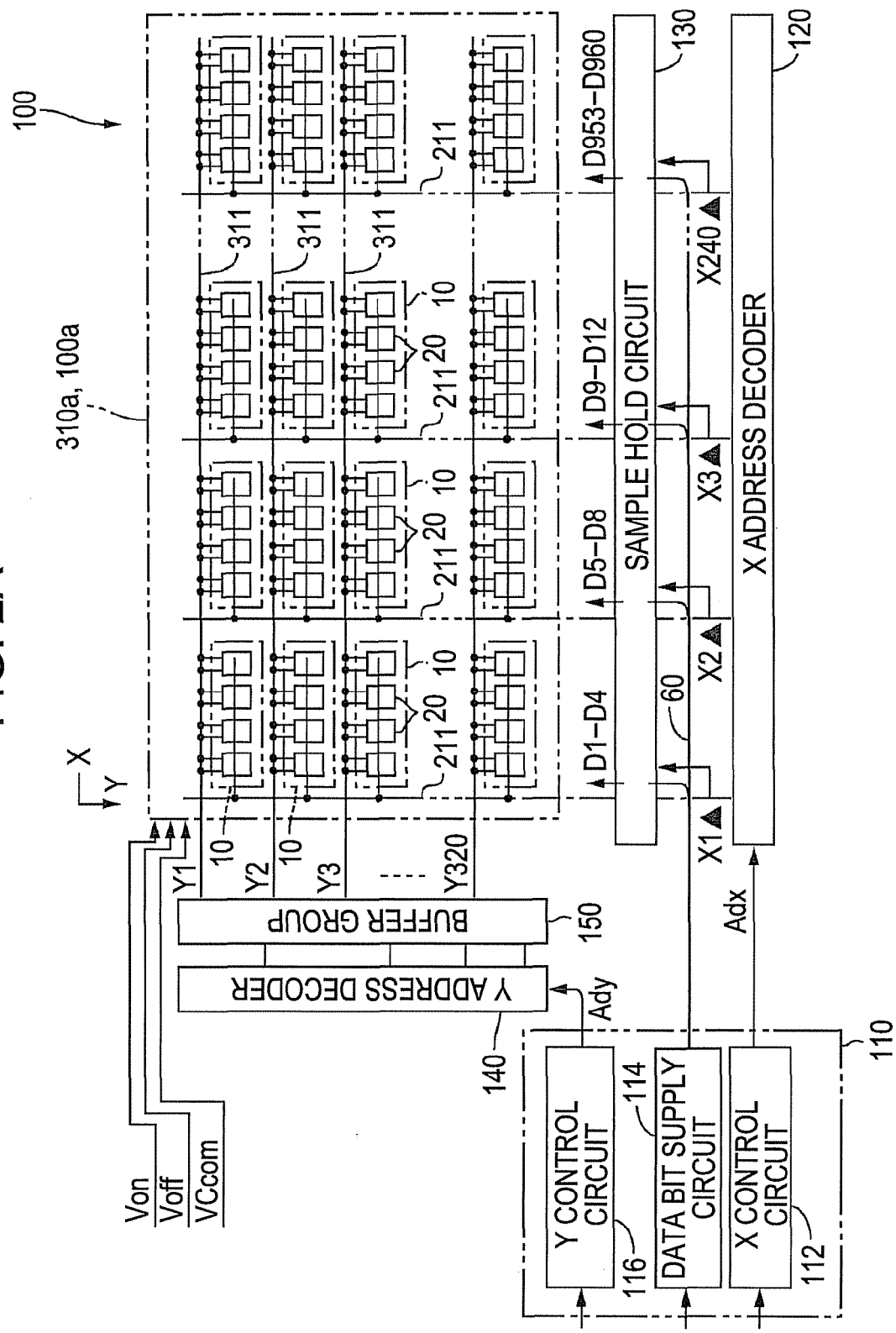
FIG. 2A is a block diagram illustrating the electrical configuration of the electro-optical device and FIG. 2B is a diagram of one of pixel circuits included in the electro-optical device.
Figure 2B:
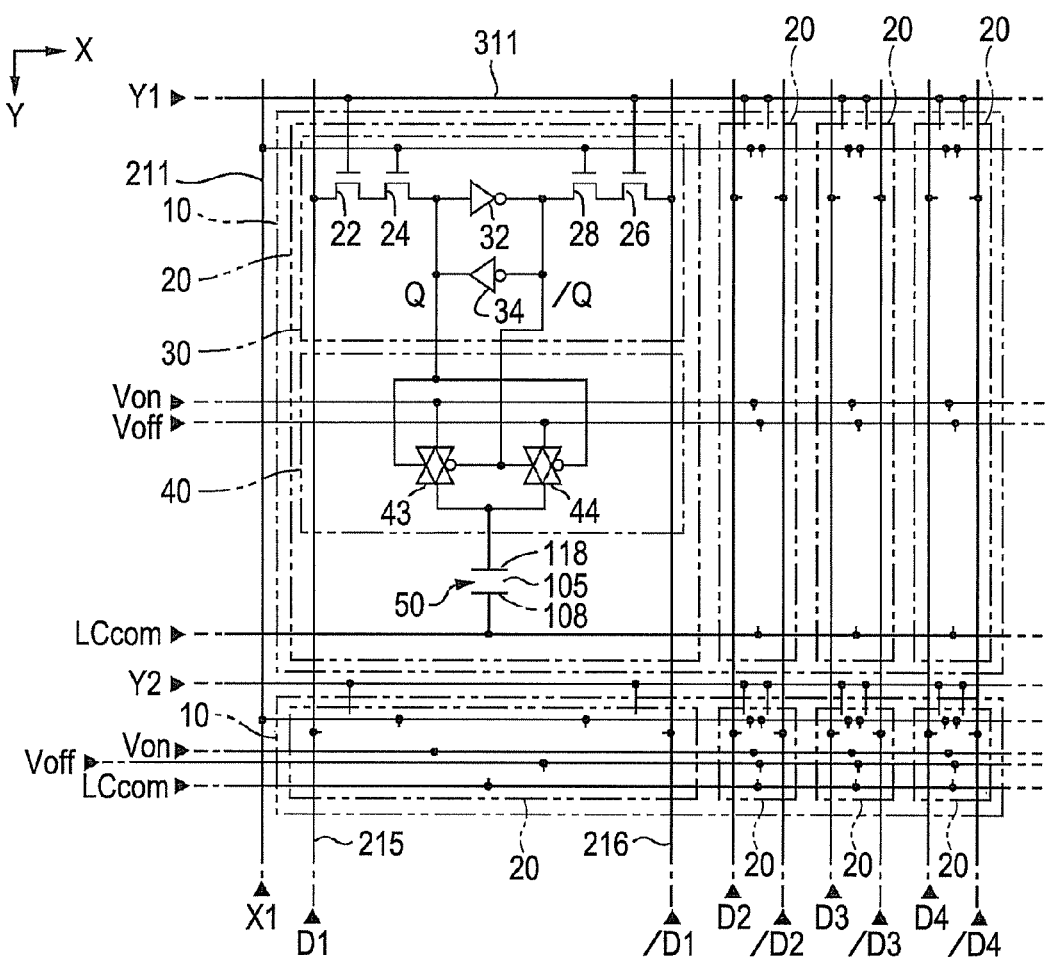
Figure 3A:
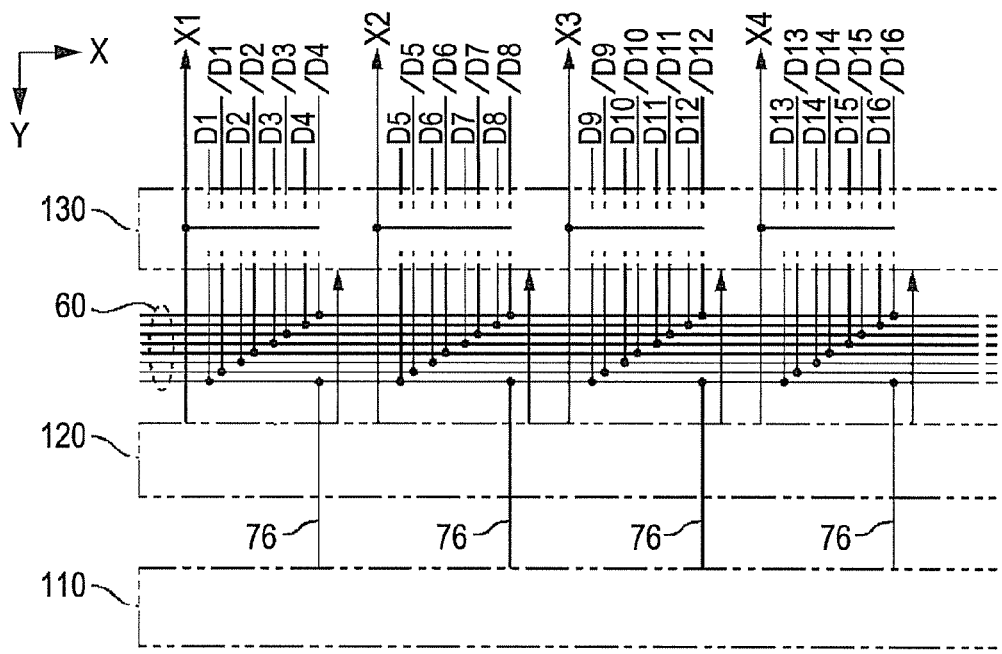
FIG. 3A is a partially enlarged view of the electro-optical device and FIG. 3B is an illustration showing the operation of writing data into memory circuits.
Figure 3B:
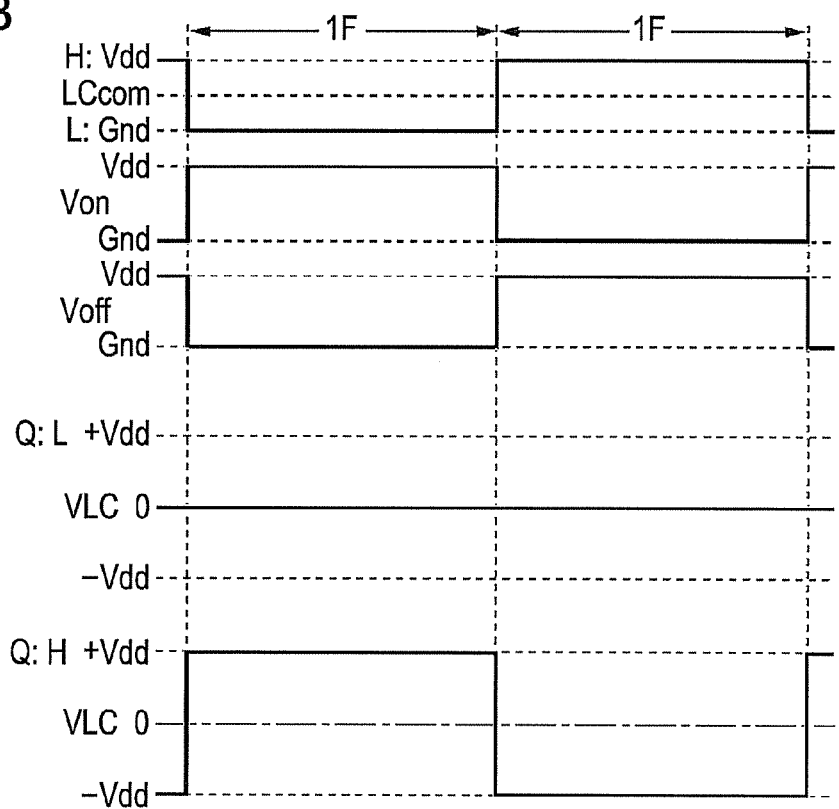

The element substrate 310 has a first surface 310e (an inside surface opposed to the counter substrate 320) having the pixel electrodes 118 arranged thereon and also has a second surface 310f (an outside surface opposed to the first surface 310e). A first molding member 410, made of a UV curable material such as an acrylic resin, for reinforcing a connecting portion between the element substrate 310 and the flexible printed circuit board 400 is located on the first surface 310e and extends from the element substrate 310 to the flexible printed circuit board 400. A second molding member 420, made of a UV curable material such as an acrylic resin, for reinforcing the connecting portion is located on the second surface 310f side and extends from the element substrate 310 to the flexible printed circuit board 400. Electrical configuration of electro-optical device FIG. 2A is a block diagram illustrating the electrical configuration of the electro-optical device 100. FIG. 2B is a diagram of one of pixel circuits 20. FIG. 3A is a partially enlarged view of the electro-optical device 100. FIG. 3B is an illustration showing the operation of writing data into memory circuits 30.

In the electro-optical device 100, the pixels 100b each include one of the memory circuits 30. The memory circuits 30 are of a static type and each store one bit. The pixels 100b are turned on or off depending on the bits stored in the memory circuits 30. Therefore, the electro-optical device 100 has a configuration below.

With reference to FIG. 2A, the image display region 100a (the pixel region 310a) includes 320 Y selection lines 311 extending in the row or X direction and 240 X selection lines 211 extending in the column or Y direction. Pixel blocks 10 are arranged so as to correspond to the intersections of the 320 Y selection lines 311 and the 240 X selection lines 211. Therefore, the pixel blocks 10 are arranged 320 rows and 240 columns. For convenience, in the image display region 100a, when the pixel blocks 10 corresponding to the first, second, third, . . . , or 240th X selection line 211 counting from the left are generally described without specifying their column, the expression "the jth-column pixel blocks 10" may be used in some cases, wherein j represents an integer satisfying the inequality $1 \leq j \leq 240$.

In this embodiment, each pixel block 10 include four of the pixel circuits 20 (the pixels 100b) arranged in the X direction. That is, the four pixel circuits 20 are arranged so as to correspond to one of the intersections of the Y selection lines 311 and the X selection lines 211. Therefore, all the pixel circuits 20 are arranged in a matrix with 320 rows and 960 (equal to 240 times four) columns. The pixel blocks 10 have the same configuration and the four pixel circuits 20 in each pixel block 10 have the same configuration. The pixel block 10 corresponding to the intersection of the first row Y selection line 311 and the first column X selection line 211 is representatively described below. The leftmost pixel circuit 20 in this pixel block 10 is described below with reference to FIG. 2B.

With reference to FIG. 2B, bit lines 215 and complementary bit lines 216 which are not shown in FIG. 2A and which extend in the column or Y direction are arranged so as to each correspond to each column of the pixel circuits 20. As described above, 960 of the pixel circuits 20 are arranged in one row; hence, the number of pairs of the bit lines 215 and the complementary bit lines 216 is 960. For convenience, in the image display region 100a, a data bit supplied to the first, second, third, . . . , or 960th bit line 215 counting from the left is represented by D1, D2, D3, . . . , or D960, respectively. An inverted data bit supplied to the first, second, third, . . . , or 960th complementary bit line 216 counting from the left is represented by /D1, /D2, /D3, . . . , or /D960, respectively. The jth-column pixel blocks 10 correspond to four pairs of the bit lines 215 and the complementary bit lines 216: a pair of the (4j−3)th bit line 215 and complementary bit line 216, a pair of the (4j−2)th bit line 215 and complementary bit line 216, a pair of the (4j−1)th bit line 215 and complementary bit line 216, and a pair of the 4jth bit line 215 and complementary bit line 216.

In this embodiment, the pixel circuits 20 each include one of the memory circuits 30, a selection circuit 40, and a liquid crystal element 50. The memory circuits 30 each include a first thin-film transistor (hereinafter simply referred to as TFT) 22, a second TFT 24, a third TFT 26, a fourth TFT 28, a first NOT (inverter) circuit 32, and a second NOT circuit 34. The first, second, third, and fourth TFTs 22, 24, 26, and 28 each function as a switching element and are of an n-channel type. The sources, drains, and gates of the first TFTs 22 are connected to the bit lines 215, the sources of the second TFTs 24, and the Y selection lines 311, respectively. The drains and gates of the second TFTs 24 are connected to the input terminals of the first NOT circuits 32 and the input terminals of the second NOT circuits 34, respectively. The input terminals of the first NOT circuits 32 (the output terminals of the second NOT circuits 34) correspond to normal terminals Q of the memory circuits 30. The input terminals of the second NOT circuits 34 (the output terminals of the first NOT circuits 32) correspond to reverse terminals /Q of the memory circuits 30. Since the memory circuits 30 are complementary, the sources, drains, and gates of the third TFTs 26 are connected to the third TFTs 26, the sources of the fourth TFTs 28, and the Y selection lines 311, respectively. The drains and gates of the fourth TFTs 28 are connected to the input terminals of the second NOT circuits 34 and the X selection lines 211, respectively.

The memory circuits 30 have such a function that when the logic level of the Y selection lines 311 is high and the logic level of the X selection lines 211 also is high, the first, second, third, and fourth TFTs 22, 24, 26, 28 are turned on at the same time such that data bits supplied to the bit lines 215 are held in the normal terminals Q and inverted data bits supplied to the complementary bit lines 216 are held in the reverse terminals /Q.

The selection circuits 40 each include a first transmission gate 43 and a second transmission gate 44. The input terminal of the first transmission gate 43 is supplied with an on-signal $V_{on}$ and the input terminal of the second transmission gate 44 is supplied with an off-signal $V_{off}$ that is logically opposed to the on-signal $V_{on}$. The input terminals of the first and second transmission gates 43 and 44 are connected to the pixel electrode 118 of one of the pixels 100b. The first transmission gate 43 and the second transmission gate 44 include a normal control gate and reverse control gate, respectively, connected to the normal terminal Q of one of the memory circuits 30. Furthermore, the first transmission gate 43 and the second transmission gates 44 include a reverse control gate and normal control gate, respectively, connected to the reverse terminal /Q of one of the memory circuits 30. The on-signal $V_{on}$ or the off-signal $V_{off}$ is used to turn one of the liquid crystal elements 50 on or off, respectively. The on-signals $V_{on}$ and the off-signals $V_{off}$ are commonly supplied to the pixel circuits 20 from an upper control circuit, which is not shown. When the normal control gate of the first or second transmission gate 43 or 44 is in a high level (that is, the reverse control gate of the first or second transmission gate 43 or 44 is in a low level), the input and output terminals of the first or second transmission gate 43 or 44 are electrically continuous with each other. When the logic level of the normal terminal Q of the memory circuit 30 is high, the first transmission gate 43 and the second transmission gate 44 are turned on and off, respectively, whereby the on-signals $V_{on}$ are each applied to one of the pixel electrodes 118. In contrast, when the logic level of the normal terminal Q thereof is low, the first transmission gate 43 and the second transmission gate 44 are turned off and on, respectively, whereby the off-signals $V_{off}$ are each applied to one of the pixel electrodes 118.

The liquid crystal elements 50 have a configuration in which the TN liquid crystal 105 is sandwiched between the common electrode 108 common to the pixels 100b and the pixel electrodes 118. As shown in FIG. 3B, the common electrode 108 is supplied with reversible signals $LC_{com}$ that are logically inverted per frame (about 16.7 milliseconds per frame). The reversible signals $LC_{com}$, as well as the on-signals $V_{on}$ and the off-signals $V_{off}$, are supplied to the pixel circuits 20 from the upper control circuit. The logic level of each reversible signal $LC_{com}$ is opposite to that of each on-signal $V_{on}$ and is identical to that of each off-signal $V_{off}$. When the logic level of the reversible signal $LC_{com}$, that of the on-signal $V_{on}$, and that of the off-signal $V_{off}$ are high or low, these logic levels are equal to a source voltage $V_{dd}$ or a ground potential $G_{nd}$, respectively. The amount of light passing through each liquid crystal element 50 per unit time is varied depending on the effective voltage held therein. In particular, the liquid crystal element 50 is set in such a normally black mode that the amount of light passing through the liquid crystal element 50 is reduced with a reduction in the effective voltage held therein. In this embodiment, a voltage for turning on or off is held in the liquid crystal element 50; hence, the liquid crystal element 50 can display one of two colors: a bright color (white) and a dark color (black).

With reference back to FIG. 2A, a timing control circuit 110 is a block including three circuits: an X control circuit 112, a data bit supply circuit 114, and a Y control circuit 116. The X control circuit 112 extracts the information identifying the X direction from the address data, supplied from the upper control circuit synchronously with a timing signal, to output an X address $A_{dx}$. The Y control circuit 116 extracts the information identifying the Y direction from the address data, supplied from the upper control circuit synchronously with a timing signal, to output a Y address $A_{dy}$. The data bit supply circuit 114 supplies eight of signal lines 60 with four data bits supplied from the upper control circuit and four inverted data bits synchronously with the X address $A_{dx}$ and the Y address $A_{dy}$, the four inverted data bits being logically opposite to the four data bits.

An X address decoder 120 supplies the X selection line 211 of the column identified by the X address $A_{dx}$ with a high-level logic signal that is a column selection signal for selecting the column and also supplies the other X selection lines 211 of the other columns with low-level logic signals that are column selection signals for selecting the other columns. For convenience, in the image display region 100a, a column selection signal supplied to the first, second, third, . . . , or 240th X selection line 211 counting from the left is represented by X1, X2, X3, . . . , or X240, respectively.

A sample hold circuit 130 serving as a sampling circuit samples the four data bits supplied to the signal lines 60 to supply the sampled four data bits to four of the bit lines 215 corresponding to the X selection lines 211 selected by the X address decoder 120 and also samples the four inverted data bits supplied to the signal lines 60 to supply the sampled four inverted data bits to four of the complementary bit lines 216 corresponding to the selected X selection lines 211. The sample hold circuit 130 may have a function of holding a sampled data bit.

A Y address decoder 140 supplies the Y selection line 311 of the row identified by the Y address $A_{dy}$ with a high-level logic signal that is a row selection signal for selecting the row and also supplies the other Y selection lines 311 of the other rows with low-level logic signals that are row selection signals for selecting the other rows.

A buffer group 150 is a cluster including buffer circuits arranged to correspond to the rows and enhances the driving ability of row selection signals to supply the X selection lines 211 with the resulting row selection signals. For convenience, in the image display region 100a, a row selection signal supplied to the first, second, third, . . . , or 320th Y selection line 311 counting from the top is represented by Y1, Y2, Y3, . . . , or Y320, respectively.

In this embodiment, the timing control circuit 110, the X address decoder 120, the sample hold circuit 130, the Y address decoder 140, and the buffer group 150 are formed on or in the element substrate 310 by a polysilicon process together with elements included in the pixel blocks 10.

Operation

The operation of the electro-optical device 100 will now be described. The electro-optical device 100 operates on the basis of the data bit stored in the memory circuit 30 of each pixel circuit 20. Therefore, the storage of the data bit in the memory circuit 30 is primarily described. In this embodi-ment, the storage of the data bit in the memory circuit 30 is performed for each pixel block 10. In the operation of storing data bits in the four pixel circuits 20 in the ith-row, jth-column pixel block 10, the upper control circuit generates an address for identifying the ith-row jth-column pixel block 10 and also generates eight bits: four data bits stored in the ith-row pixel circuits 20 located in the (4j−3)th to 4jth columns and four inverted data bits logically opposite to the four data bits.

The X control circuit 112 supplies the X address decoder 120 with an X address $A_{dx}$ among addresses supplied to the X control circuit 112. The Y control circuit 116 supplies the Y address decoder 140 with a Y address $A_{dy}$ among addresses supplied to the Y control circuit 116. The data bit supply circuit 114 supplies the signal lines 60 with eight of the supplied and inverted data bits through wires 76 synchronously with the timing of supplying the X address $A_{dx}$ and the Y address $A_{dy}$.

The X address $A_{dx}$ allows the X address decoder 120 to amplify a column selection signal to a high level. This allows the sample hold circuit 130 to sample four data bits to be stored for four of the bit lines 215 corresponding to the jth column and also allows the sample hold circuit 130 to sample four inverted data bits logically opposite to the four data bits for four of the complementary bit lines 216 corresponding to the jth column. In particular, the sample hold circuit 130 samples the data bits to be stored in the (4j−3)th to 4jth column pixel circuits 20 arranged in the ith row to supply the (4j−3)th to 4jth column bit lines 215 with D(4j−3), D(4j−2), D(4j−1), and D(4j) and also samples the inverted data bits to supply the (4j−3)th to 4jth column complementary bit lines 216 with /D(4j−3), /D(4j−2), /D(4j−1), and /D(4j). Therefore, the other bit lines 215 and the other complementary bit lines 216 are supplied with no data bits.

The Y address $A_{dy}$ identifying the ith row allows the Y address decoder 140 to amplify only row selection signals $Y_i$ to a high level. In the four pixel circuits 20 included in the ith-row, jth-column pixel block 10, the row selection signals $Y_i$ are amplified to a high level and therefore the first and third TFTs 22 and 26 are turned on. Furthermore, column selection signals $X_j$ are amplified to a high level and therefore the second and fourth TFTs 24 and 28 are turned on. Hence, the data bits supplied to the bit lines 215 are written in the normal terminals Q and the inverted data bits supplied to the complementary bit lines 216 are written in the reverse terminals /Q.

In this state, if either the row selection signals $Y_i$ or the column selection signals $X_j$ or both of the row selection signals $Y_i$ and the column selection signals $X_j$ are attenuated to a low level, the first and third TFTs 22 and 26, second and fourth TFTs 24 and 28, or first to fourth TFTs 22 to 28 in the four pixel circuits 20 included in the ith-row, jth-column pixel block 10 are turned off. Therefore, in the memory circuits 30, the normal terminals Q and the reverse terminals /Q are electrically separated from the bit lines 215 and the complementary bit lines 216, respectively, and the memory circuits 30 hold written data bits.

When the column selection signals $X_j$ and the row selection signals $Y_i$ are in a high level, either row selection signals or column selection signals held in the pixel circuits 20 of the pixel blocks 10 other than the ith-row, jth-column pixel block 10 or both of these row and column selection signals are in a low level. Therefore, in these pixel circuits 20, the first and third TFTs 22 and 26, the second and fourth TFTs 24 and 28, or the first to fourth TFTs 22 to 28 are turned off and therefore the normal terminals Q of the memory circuits 30 are electrically separated from the bit lines 215 and the reverse terminals /Q are electrically separated from the complementary bit lines 216. Hence, the memory circuits 30 of the pixel circuits 20 of the pixel blocks 10 other than the ith-row, jth-column pixel block 10 are prevented from being affected by changes in the voltages of the bit lines 215 and the complementary bit lines 216. That is, the memory circuits 30 of these pixel circuits 20 hold data bits written therein independently of the voltages of the bit lines 215 and the complementary bit lines 216.

The above writing operation is performed in all the pixel blocks 10 shortly after the electro-optical device 100 is turned on. This allows the memory circuits 30 of all the pixel circuits 20 to hold high- or low-level data bits. When a display content is changed, data bits identifying a new display content and inverted data bits logically opposite to these data bits are supplied from the upper control circuit together with an address, these data bits and inverted data bits totaling eight bits, whereby data bits held in the four memory circuits 30 of the pixel block 10 identified by the address are rewritten.

How the liquid crystal elements 50 operate when data bits are held in the pixel circuits 20 will now be described. In the memory circuits 30 of the pixel circuits 20, if the normal terminals Q are held in a low level (that is, if the reverse terminals /Q are held in a high level), the first transmission gates 43 are turned off and the second transmission gates 44 are turned on, whereby off-signals $V_{off}$ having the same logic as that of the common electrode 108 are applied to the pixel electrodes 118 of the pixels 100b. Therefore, as shown in FIG. 3B, the voltage $V_{lc}$ applied to each liquid crystal element 50, that is, the potential difference between the common electrode 108 and each pixel electrode 118 is zero; hence, the pixel blocks 10 are turned off and therefore become dark if the electro-optical device 100 operates in a normally black mode.

In the memory circuits 30 of the pixel circuits 20, if the normal terminals Q are held in a high level (that is, if the reverse terminals /Q are held in a low level), the first transmission gates 43 are turned on and the second transmission gates 44 are turned off, whereby on-signal $V_{on}$ having the logic opposite to that of the common electrode 108 are applied to the pixel electrodes 118 of the pixels 100b. Therefore, as shown in FIG. 3B, the voltage $V_{lc}$ applied to each liquid crystal element 50 is equal to $+V_{dd}$ or $-V_{dd}$; hence, the pixel blocks 10 are turned on and therefore become bright if the electro-optical device 100 operates in a normally black mode.

As described above, the pixel blocks 10 are turned on or off with the pixel circuits 20 depending on the state of the memory circuits 30, whereby a predetermined image is displayed. Data bits are stored in the memory circuits 30 while data is unchanged; hence, refresh is not necessary to display a still image. This allows driving circuits not to operate and therefore leads to a reduction in powder consumption.

Data bits stored in the memory circuits 30 are rewritten for each pixel block 10, which corresponds to one of the intersections of the X selection lines 211 and the Y selection lines 311. In the pixel blocks 10 other than one identified by an address, the normal terminals Q and reverse terminals /Q of the memory circuits 30 are electrically separated from the bit lines 215 and the complementary bit lines 216, respectively; hence, the data bits stored in the memory circuits 30 can be prevented from being affected by the noise caused by the bit lines 215 and the complementary bit lines 216. In this embodiment, since the X control circuit 112, the data bit supply circuit 114, and the Y control circuit 116 are integrated in the timing control circuit 110, which is a functional block, the element substrate 310 has a reduced size in the X direction.

In this embodiment, the number of the pixel circuits 20 included in each pixel block 10 is four. The number of the pixel circuits 20 in the pixel block 10 is not limited to four and may be one. The timing control circuit 110, the X address decoder 120, the sample hold circuit 130, the Y address decoder 140, and the buffer group 150 are formed in or one the element substrate 310 by the polysilicon process as described above and may be mounted in or on the element substrate 310 in the form of IC chips. The reversible signal $LC_{com}$ is logically inverted per frame as described above. This is only because the liquid crystal elements 50 are alternately driven. Therefore, the reversible signal $LC_{com}$ may be logically inverted per two or more frames. The upper control circuit supplies data bits and inverted data bits logically opposite to these data bits as described above. The upper control circuit may supply these data bits and a NOT circuit for logically inverting these data bits may be provided in the electro-optical device 100. The liquid crystal elements 50 operate in the normally black mode as described above and may operate in such a normally white mode that the liquid crystal elements 50 are dark when no voltages are applied to the liquid crystal elements 50. For convenience, the electro-optical device 100 displays a binary image formed by turning on or off the pixels 100b as described above. The pixel circuits 20 may be arranged in the X direction so as to each correspond to one of the three primary colors of red, green, and blue such that an eight-color image can be displayed. The memory circuits 30 may be of a dynamic type.

Configuration of Element Substrate 310

FIG. 4 is a plan view of the element substrate 310. With reference to FIGS. 1A, 1B, 1C, and 4, the element substrate 310 has the pixel region 310a, which is located in a center area thereof and includes the pixels 100b, which are arranged in a matrix pattern and include the pixel electrodes 118. The pixel region 310a may include dummy pixels arranged in a region overlapping with the first light-shielding layer 308. In this case, the image display region 100a is a portion of the pixel region 310a exclusive of the dummy pixels.

The element substrate 310 is rectangular and is long in the X direction. The connection terminals 102 are arranged along a longitudinal side of the element substrate 310. An electrostatic protection circuit 190 and a first circuit region 101 are arranged near this longitudinal side in that order. The electrostatic protection circuit 190 and the first circuit region 101 extend in the X direction. A first inspection circuit 160 is located on the side opposite to the first circuit region 101 with the pixel region 310a disposed therebetween. The first circuit region 101 contains the timing control circuit 110, the X address decoder 120, and the sample hold circuit 130, which are arranged near the electrostatic protection circuit 190 in that order.

A second circuit region 104 extending in the Y direction is located along a lateral side of the element substrate 310. A second inspection circuit 170 is located on the side opposite to the scanning line-driving circuits 104 with the pixel region 310a disposed therebetween. The second circuit region 104 contains the buffer group 150 and the Y address decoder 140 located outside the buffer group 150.

The following members are arranged outside the pixel region 310a: the connection terminals 102; the electrostatic protection circuit 190; the first circuit region 101, which contains the timing control circuit 110, X address decoder 120, and the sample hold circuit 130; the second circuit region 104, which contains the Y address decoder 140 and the buffer group 150; and the first and second inspection circuits 160 and 170. These members are also arranged outside the sealing member 107.

The element substrate 310 includes first wires 72, second wires 74, third wires 76, fourth wires 78, fifth wires 81, sixth wires 82, and seventh wires 84. The first wires 72 transmit data bits or various timing signals, supplied to the connection terminals 102 from the upper control circuit through the flexible printed circuit board 400, to the timing control circuit 110. The second wires 74 transmit an X address $A_{dx}$ and clock signals, supplied from the timing control circuit 110, to the X address decoder 120. The third wires 76 extend through a region containing the X address decoder 120 to reach eight of the signal lines 60 extending between the X address decoder 120 and the sample hold circuit 130 in the X direction and transmit data bits, adjusted in timing by the timing control circuit 110, to the eight signal lines 60. In particular, the number of the third wires 76 is eight and the third wires 76 transmit four data bits corresponding to the four pixel circuits 20 included in each pixel block 10 and four inverted data bits logically opposite to these data bits. The third wires 76 are each connected to one of the signal lines 60. The eight signal lines 60 each correspond to one of the bit lines 215 and complementary bit lines 216 corresponding to the first, second, third, and fourth pixel circuits 20, included in each pixel block 10, counting from the left as shown in FIG. 3A. A row selection signal in a high level allows the bit lines 215 and complementary bit lines 216 of the pixel blocks 10 corresponding to the row selection signal to sample the data bits and inverted data bits supplied to the eight signal lines 60. Since FIG. 3A partially shows the timing control circuit 110, the X address decoder 120, and the sample hold circuit 130, only four of the third wires 76 are connected to four of the signal lines 60 as shown in this figure. Actually, the number of the third wires 76 is eight as described above. All the eight third wires 76 are each connected to one of the eight signal lines 60. The fourth wires 78 supply the voltages, supplied to the X address decoder 120 from a power supply, to the Y address decoder 140. The fifth wires 81 transmit a Y address $A_{dy}$ and clock signals, supplied from the timing control circuit 110, to the Y address decoder 140.

The first and second inspection circuits 160 and 170 are used to check whether the following members electrically operate properly, in advance of bonding the element substrate 310 and the counter substrate 320 together: the timing control circuit 110, the X address decoder 120, the sample hold circuit 130, the Y address decoder 140, the buffer group 150, and the pixel blocks 10 arranged in the image display region 100a. Therefore, the first inspection circuit 160 is connected to the X selection lines 211, the bit lines 215, and the complementary bit lines 216. The second inspection circuit 170 is connected to ends of the Y selection lines 311. Output signals for inspection are output from the connection terminals 102 through the sixth wires 82.

Substrate-connecting electrodes 182 are arranged outside the image display region 100a and are located at opposing corners of the element substrate 310. The substrate-connecting electrodes 182 are used to apply the reversible signals $LC_{com}$ to the common electrode 108 of the counter substrate 320. The element substrate 310 is bonded to the counter substrate 320 with the sealing member 107 disposed therebetween as described above. In this operation, the substrate-connecting electrodes 182 are electrically connected to the common electrode 108 with conductive members disposed at positions corresponding to the substrate-connecting electrodes 182. The substrate-connecting electrodes 182 are connected to the connection terminals 102 with the seventh wires 84; hence, the reversible signals $LC_{com}$ are applied to the common electrode 108 through the connection terminals 102 of the element substrate 310.

Configuration of Electrostatic Protection Circuit 190

Figure 5A:
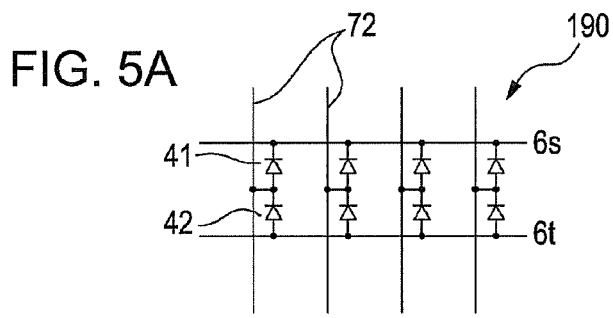
FIG. 5A is a diagram of an electrostatic protection circuit included in the electro-optical device.
Figure 5B:
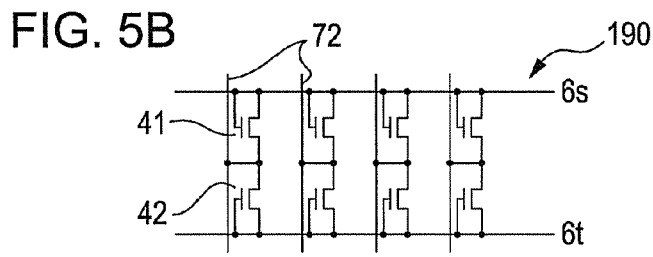
FIG. 5B is a diagram of a modification of the electrostatic protection circuit.
Figure 5C:
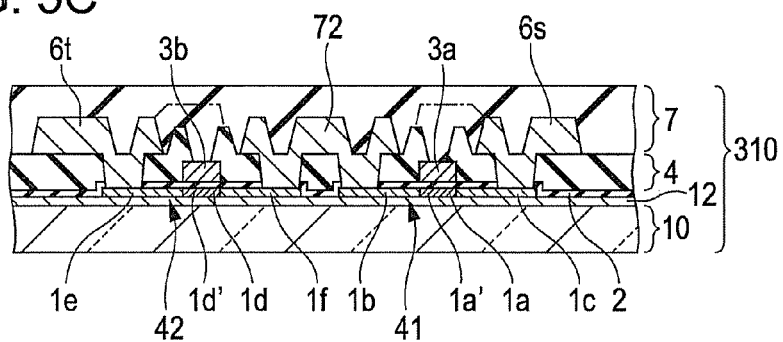
FIG. 5C is a sectional view of the electrostatic protection circuit.
Figure 5D:
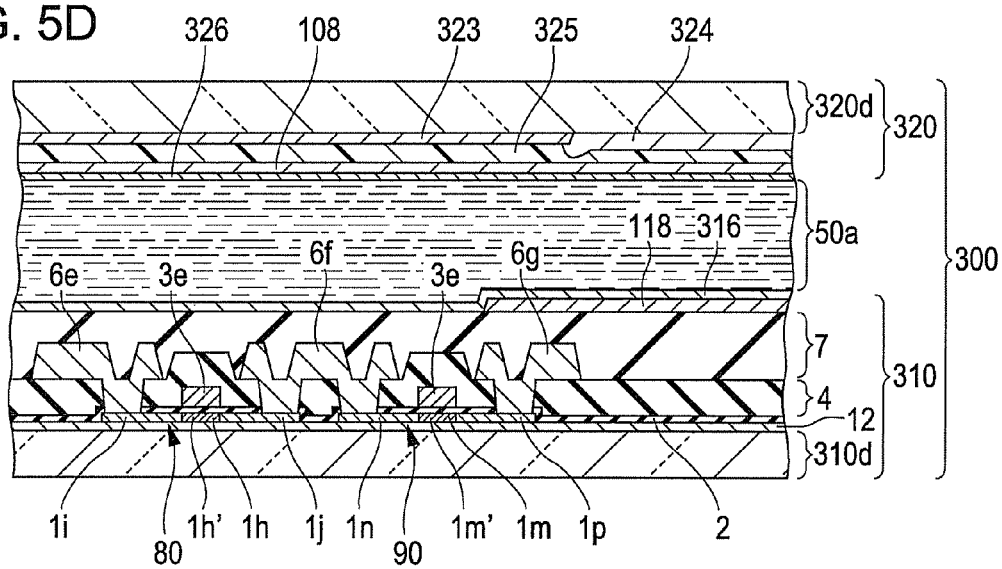
FIG. 5D is a sectional view of one of pixels included in the electro-optical device.

FIG. 5A is a diagram of the electrostatic protection circuit 190, which is included in the electro-optical device 100. FIG. 5B is a diagram of a modification of the electrostatic protection circuit 190. FIG. 5C is a sectional view of the electrostatic protection circuit 190. FIG. 5D is a sectional view of one of the pixels 100b.

Circuits included in the electro-optical device 100 may be broken or damaged by electrostatic discharge while the liquid crystal panel 300 is in process, is being conveyed in a non-operation mode, or is being operated. In order to cope with such a problem, the element substrate 310 includes the electrostatic protection circuit 190 connected to the first wires 72 connecting the connection terminals 102 to the timing control circuit 110.

With reference to FIG. 5A, the electrostatic protection circuit 190 includes a first high-potential line 6s, a first low-potential line 6t, first diode elements 41 disposed between the first high-potential line 6s and the first wires 72, and second diode elements 42 disposed between the first low-potential line 6t and the first wires 72. The anodes and cathodes of the first diode elements 41 are electrically connected to the first wires 72 and the first high-potential line 6s, respectively. In contrast, the cathodes and anodes of the second diode elements 42 are electrically connected to the first wires 72 and the first low-potential line 6t, respectively. Resistors (not shown) for protecting the first and second diode elements 41 and 42 from inrush currents are preferably disposed in wire portions located between the first and second diode elements 41 and 42.

The first and second diode elements 41 and 42 may each include a pin diode or a MOS diode including TFTs diode-connected to each other. MOS diodes including n-type TFTs diode-connected to each other are shown in FIGS. 5B and 5C. The MOS diodes have substantially the same configuration as that of complementary TFTs (p-channel TFTs 80 and n-channel TFTs 90) included in the pixels 100b. The MOS diodes and the complementary TFTs are formed together by a procedure for forming either the MOS diodes or the complementary TFTs. The configuration of the electrostatic protection circuit 190 will now be described together with the configuration of the complementary TFTs.

With reference to FIGS. 5C and 5D, the element substrate 310 includes a base-protecting layer 12, made of silicon dioxide or the like, lying on the first transparent plate 310d. The following layers are arranged on the base-protecting layer 12 in a dotted pattern: first semiconductor layers 1a for forming the first diode elements 41, second semiconductor layers 1d for forming the second diode elements 42, third semiconductor layers 1h for forming the complementary TFTs, and fourth semiconductor layers 1m for forming the complementary TFTs. A gate-insulating layer 2 extends over the first, second, third, and fourth semiconductor layers 1a, 1d, 1h, and 1m. The following layers are arranged on the gate-insulating layer 2: first gate electrodes 3a, second gate electrodes 3b, and third gate electrodes 3e. A first interlayer insulating layer 4 and a second interlayer insulating layer 7 lie over the first, second, and third gate electrodes 3a, 3b, and 3e in that order.

The first, second, third, and fourth semiconductor layers 1a, 1d, 1h, and 1m can be formed by the following procedure: for example, an amorphous silicon layer is formed above the element substrate 310 and then polycrystallized into a polysilicon layer by laser annealing or lamp annealing and the polysilicon layer is processed. Therefore, the first transparent plate 310d, which is made of glass, can be used to form the element substrate 310. Alternatively, a quartz substrate may be used to form the element substrate 310. The first, second, third, and fourth semiconductor layers 1a, 1d, 1h, and 1m may be formed by processing a single-crystalline silicon layer. Such a configuration can be obtained by the use of a silicon-on-insulator (SOI) substrate including an insulating layer, a quartz plate, and a single-crystalline silicon plate bonded to the quartz plate with the insulating layer disposed therebetween. The SOI substrate can be formed in such a manner that a silicon dioxide layer is formed on the single-crystalline silicon plate and then bonded to the quartz plate or in such a manner that silicon dioxide layers are each formed on the single-crystalline silicon plate and the quartz plate and then bonded to each other. In the case where the SOI substrate is used, the gate-insulating layer 2 can be formed by thermally oxidizing a semiconductor layer.

Each first semiconductor layer 1a has a first semiconductor region 1a' opposed to one of the first gate electrodes 3a, each second semiconductor layer 1d has a second semiconductor region 1d' opposed to one of the second gate electrodes 3b, each third semiconductor layer 1h has a third semiconductor region 1h' opposed to one of the third gate electrodes 3e, and each fourth semiconductor layer 1m has a fourth semiconductor region 1m' opposed to one of the third gate electrodes 3e. The first, second, third, and fourth semiconductor regions 1a', 1d', 1h', and 1m' are separated from the first, second, and third gate electrodes 3a, 3b, and 3e and correspond to channel regions. The first semiconductor layer 1a has a first negative impurity-doped region 1b and second negative impurity-doped region 1c located on both sides of the first semiconductor region 1a', the second semiconductor layer 1d has a third negative impurity-doped region 1e and fourth negative impurity-doped region if located on both sides of the second semiconductor region 1d', and the fourth semiconductor layer 1m has a fifth negative impurity-doped region in and sixth negative impurity-doped region 1p located on both sides of the fourth semiconductor region 1m'. The third semiconductor layer 1h has a seventh negative impurity-doped region 1i and eight negative impurity-doped region 1j located on both sides of the third semiconductor region 1h'. When the complementary TFTs have a lightly doped drain (LDD) structure, the third and fourth semiconductor layers 1h and 1m each have a lightly doped region and a heavily doped region.

With reference to FIG. 5C, in a region for forming one of the first diode elements 41 and one of the second diode elements 42, the first high-potential line 6s, the first low-potential line 6t, and the first wires 72 extend on the first interlayer insulating layer 4. These wires are electrically connected to the first, second, third, and fourth negative impurity-doped regions 1b, 1c, 1e, and 1f with contact holes extending through the first interlayer insulating layer 4 and the gate-insulating layer 2. The first high-potential line 6s and first low-potential line 6t are electrically connected to the first and second gate electrodes 3a and 3b with contact holes extending through the first interlayer insulating layer 4. The first and second diode elements 41 and 42 (MOS diodes) are configured as described above.

With reference to FIG. 5D, in a region for forming one of the complementary TFTs, a second high-potential line 6e, a second low-potential line 6g, and an output line 6f extend on the first interlayer insulating layer 4. The second high-potential line 6e and the second low-potential line 6g are electrically connected to the source regions (the seventh and sixth negative impurity-doped region 1i and 1p) of the third and fourth semiconductor layers 1h and 1m with contact holes extending through the first interlayer insulating layer 4 and the gate-insulating layer 2. The output line 6f is electrically connected to the drain regions (the eight and fifth negative impurity-doped regions 1j and 1n) of the third and fourth semiconductor layers 1h and 1m with a contact hole extending through the first interlayer insulating layer 4 and the gate-insulating layer 2. An input line, which is not shown, is electrically connected to one of the third gate electrodes 3e with a contact hole extending through the first interlayer insulating layer 4. The complementary TFTs are configured as described above. The first and second diode elements 41 and 42 can be formed by a procedure for forming the complementary TFTs using pin diodes. In the pixels 100b, the pixel electrodes 118 are arranged on the second interlayer insulating layer 7 and a first alignment layer 316 extends over the pixel electrodes 118. The counter substrate 320 includes the second light-shielding layer 323, a color filter 324, a polarization layer (protective layer) 325, the common electrode 108, and a second alignment layer 326, these members being arranged on or above a surface of the second transparent plate 320d that is opposed to the element substrate 310.

Method for Manufacturing Electro-Optical Device 100

Figure 6A:
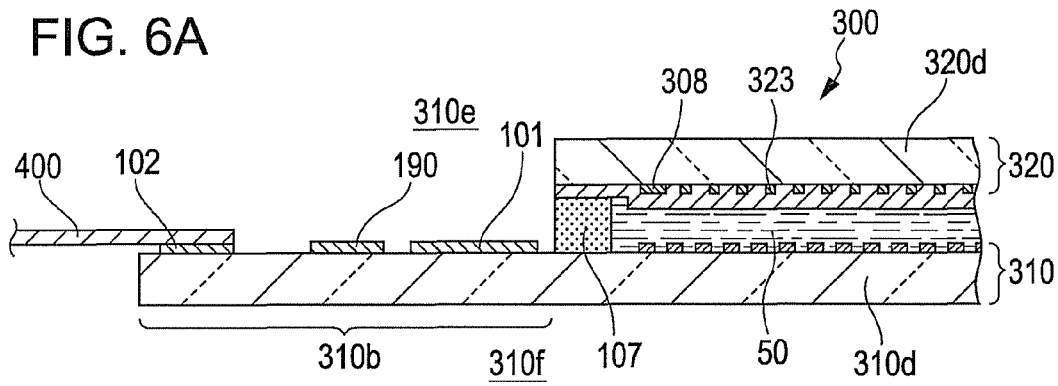
FIGS. 6A, 6B, and 6C are sectional views illustrating steps of forming a first molding member and second molding member included in the electro-optical device.
Figure 6B:
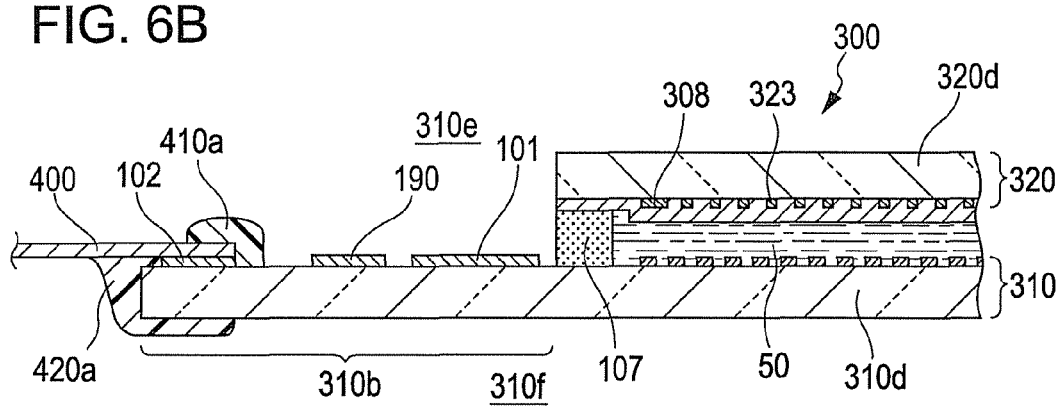
Figure 6C:
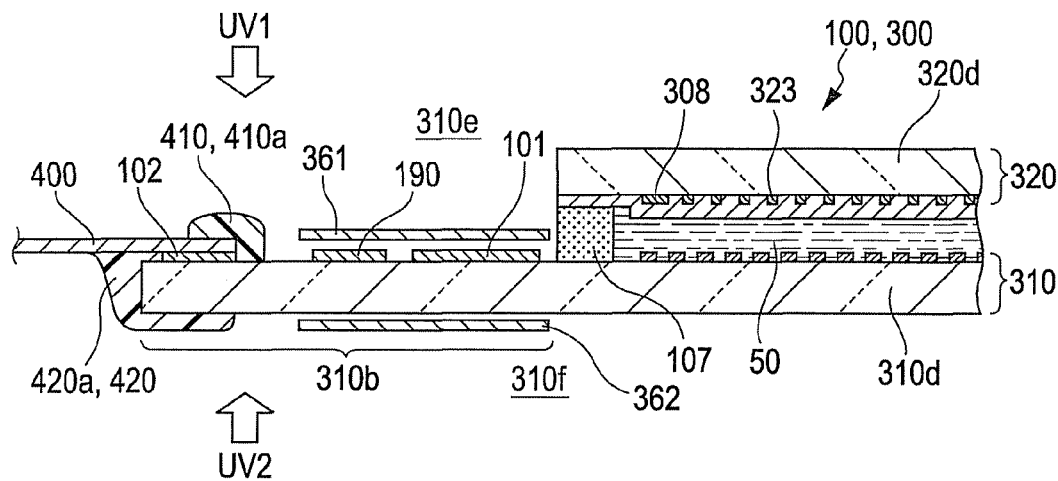

A method for manufacturing the electro-optical device 100 according to the present invention will now be described. FIGS. 6A, 6B, and 6C are sectional views illustrating steps of forming the first and second molding members 410 and 420. The manufacture of the electro-optical device 100 starts with the preparation of the liquid crystal panel 300 shown in FIGS. 1A, 1B, and 1C. As shown in FIG. 6A, the flexible printed circuit board 400 is connected to the connection terminals 102 with the anisotropic conductive material.

As shown in FIG. 6B, a first UV-curable resin composition 410a is applied to the first surface 310e of the element substrate 310 (the inside surface of the element substrate 310 that is opposed to the counter substrate 320) so as to extend from the element substrate 310 to the flexible printed circuit board 400. A second UV-curable resin composition 420a is applied to the second surface 310f of the element substrate 310 (the outside surface of the element substrate 310 that is opposed to the first surface 310e) so as to extend from the element substrate 310 to the flexible printed circuit board 400.

As shown in FIG. 6C, UV light is applied to the first surface 310e of the element substrate 310 as indicated by Arrow UV1, whereby the first UV-curable resin composition 410a is cured such that the first molding member 410 is formed. In advance of this operation, a first light-shielding sheet 361 (a light-shielding) is provided on the first surface 310e so as to overlap with the electrostatic protection circuit 190. The first light-shielding sheet 361 is made of a light-shielding resin or a metal such as W, Ti, Cr, or aluminum (Al). This allows the first UV-curable resin composition 410a to be cured without irradiating the electrostatic protection circuit 190 with UV light, thereby forming the first molding member 410.

In this embodiment, the first light-shielding sheet 361 preferably overlaps with the first circuit region 101 in addition to the electrostatic protection circuit 190. In order to illustrate that the element substrate 310 is different from the first light-shielding sheet 361, the element substrate 310 is spaced from the first light-shielding sheet 361 as shown in FIG. 3C. The element substrate 310 may be spaced from or may be in contact with the first light-shielding sheet 361.

UV light is applied to the second surface 310f of the element substrate 310 as indicated by Arrow UV2, whereby the second UV-curable resin composition 420a is cured such that the second molding member 420 is formed. In advance of this operation, a second light-shielding sheet 362 for shielding light is provided on the second surface 310f so as to overlap with the electrostatic protection circuit 190. The second light-shielding sheet 362 is made of a light-shielding resin or a metal such as W, Ti, Cr, or Al. This allows the first UV-curable resin composition 410a to be cured without irradiating the electrostatic protection circuit 190 with UV light, thereby forming the second molding member 420.

In this embodiment, the second light-shielding sheet 362 preferably overlaps with the first circuit region 101 in addition to the electrostatic protection circuit 190. In order to illustrate that the element substrate 310 is different from the second light-shielding sheet 362, the second light-shielding sheet 362 is spaced from the element substrate 310 as shown in FIG. 3C. The second light-shielding sheet 362 may be spaced from or may be in contact with the first light-shielding sheet 361.

Principal Advantages of this Embodiment

In this embodiment, in the operation of forming the first and second molding members 410 and 420, the first and second UV-curable resin compositions 410a and 420a are cured without irradiating the electrostatic protection circuit 190 with UV light as described above. Therefore, current-voltage properties of the first and second diode elements 41 and 42 are not varied. This prevents unnecessary currents from flowing through the first and second diode elements 41 and 42. Hence, the presence of the electrostatic protection circuit 190 does not lead to an increase in powder consumption.

Since the pixels 100b each include one of the memory circuits 30, the electro-optical device 100 has low powder consumption. If current-voltage properties of the first and second diode elements 41 and 42 are varied by the irradiation with UV light and therefore the powder consumption of the electro-optical device 100 is increased, the memory circuits 30 will lose the reason for their existence. However, according to this embodiment, the following object can be achieved: an object that the power consumption of the electro-optical device 100 is reduced by providing the memory circuits 30 in the pixels 100b.

In this embodiment, the first and second molding members 410 and 420 are placed on the first and second surface 310e and 310f, respectively, of the element substrate 310. The element substrate 310 may have only one of the first and second molding members 410 and 420. In this case, the use of the first or second light-shielding sheet 361 or 362 shown in FIG. 6C prevents the electrostatic protection circuit 190 from being irradiated with UV light.

The first and second UV-curable resin compositions 410a and 420a are used to form the first and second molding members 410 and 420, respectively, as described above. The following resin may be used to form the first and second molding members 410 and 420 instead of the first and second UV-curable resin compositions 410a and 420a: a room-temperature-curable resin such as a silicone resin, a heat-curable resin such as an epoxy resin, or a visible light-curable resin. The use of such a resin prevents the electrostatic protection circuit 190 from being irradiated with UV light when the first and second molding members 410 and 420 are formed. The element substrate 310 may have both or only one of the first and second molding members 410 and 420.

The first and second light-shielding sheets 361 and 362 used in this embodiment completely blocks UV light. A translucent light-shielding sheet, such as a planarizing sheet, partially blocking UV light may be used in this embodiment.

Second Embodiment

FIG. 7A is a plan view of an electro-optical device 100 according to a second embodiment of the present invention. FIG. 7B is a bottom view of the electro-optical device 100. FIG. 7C is a sectional view of the electro-optical device 100 taken along the line VIIC-VIIC of FIG. 7A. The spatial relationships of members shown in FIG. 7B agree with those of the members shown in FIG. 7A. The configuration of the electro-optical device 100 is the same as that described in the first embodiment with reference to FIGS. 1A to 1C and therefore will not be described in detail.

The electrical configuration and operation of the electro-optical device 100 is the same as those described in the first embodiment with reference to FIGS. 2 and 3 and therefore will not be described in detail. The configuration of an element substrate 310 is the same as that described in the first embodiment with reference to FIG. 4 and therefore will not be described in detail. The configuration of an electrostatic protection circuit 190 is the same as that described in the first embodiment with reference to FIG. 5 and therefore will not be described in detail.

Method for Manufacturing Electro-Optical Device 100 and Principal Advantages of this Embodiment The manufacture of the electro-optical device 100 starts with the preparation of a liquid crystal panel 300 shown in FIGS. 7A, 7B, and 7C. A flexible printed circuit board 400 is then connected to connection terminals 102, arranged on the element substrate 310, with an anisotropic conductive material.

The element substrate 310 has a first surface 310e (an inside surface opposed to a counter substrate 320) having pixel electrodes 118 arranged thereon and also has a second surface 310f (an outside surface opposed to the first surface 310e). A first molding member 410 made of a UV curable material such as an acrylic resin is provided on the first surface 310e so as to extend from the element substrate 310 to the flexible printed circuit board 400. UV light is applied to the first surface 310e of the element substrate 310 as indicated by Arrow UV1, whereby the first molding member 410 is cured. On the other hand, no UV-curable molding member for reinforcement is provided on the second surface 310f of the element substrate 310.

In this embodiment, in order to reinforce a connecting portion between the element substrate 310 and the first molding member 410, the first molding member 410 is provided on the first surface 310e of the element substrate 310 so as to extend from the element substrate 310 to the flexible printed circuit board 400; however, no UV-curable molding member for reinforcement is provided on the second surface 310f of the element substrate 310. Therefore, the first surface 310e of the element substrate 310 is irradiated with UV light but the second surface 310f of the element substrate 310 is not irradiated with UV light. Therefore, UV light is incident on first diode elements 41 and second diode elements 42 included in the electrostatic protection circuit 190 once when UV light is applied to the first surface 310e of the element substrate 310, although the electrostatic protection circuit 190 is adjacent to a region containing the connection terminals 102. Hence, current-voltage properties of the first and second diode elements 41 and 42 are not varied or are only slightly varied. This prevents currents from leaking from the first and second diode elements 41 and 42. Hence, the presence of the electrostatic protection circuit 190 does not lead to an increase in powder consumption.

Pixels 100b included in the electro-optical device 100 each include a memory circuit 30; hence, the electro-optical device 100 has low powder consumption. If current-voltage properties of the first and second diode elements 41 and 42 are varied by the irradiation with UV light and therefore the powder consumption of the electro-optical device 100 is increased, the memory circuits 30 will lose the reason for their existence. However, according to this embodiment, the following object can be achieved: an object that the power consumption of the electro-optical device 100 is reduced by providing the memory circuits 30 in the pixels 100b.

The first molding member 410 is preferably spaced from the electrostatic protection circuit 190 at a distance of 1 mm or more in the in-plane direction of the element substrate 310, the distance therebetween being represented by d1 in FIG. 7C. This prevents the first and second diode elements 41 and 42 of the electrostatic protection circuit 190 from being directly irradiated with UV light when UV light is applied to the first surface 310e of the element substrate 310 such that the first molding member 410 is cured.

Figure 8A:
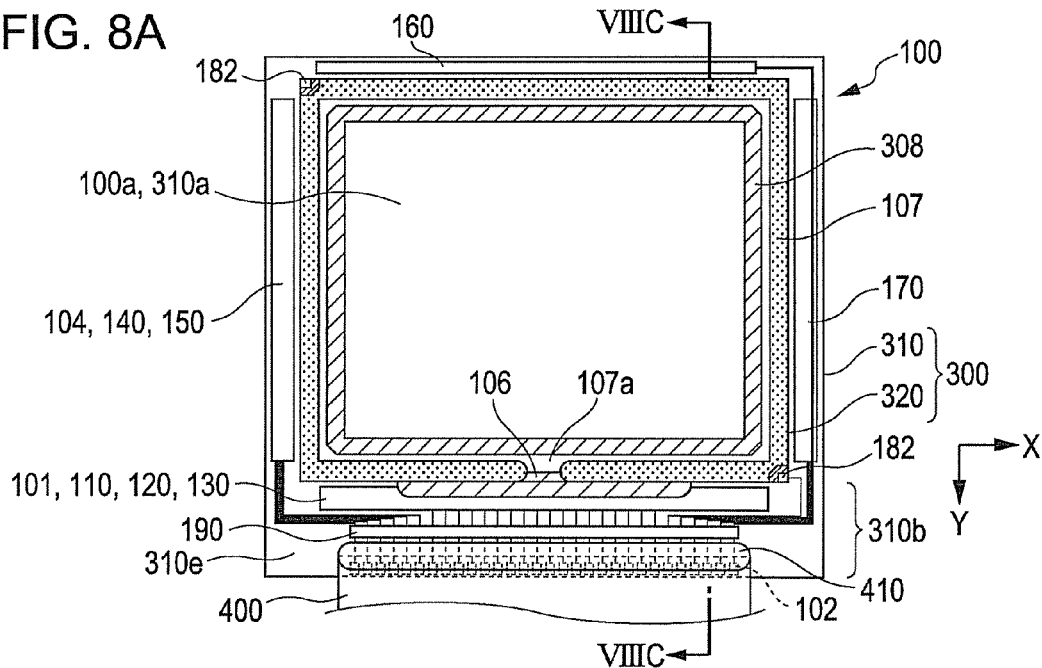
FIG. 8A is a plan view of a modification of the electro-optical device according to the second embodiment.
Figure 8B:
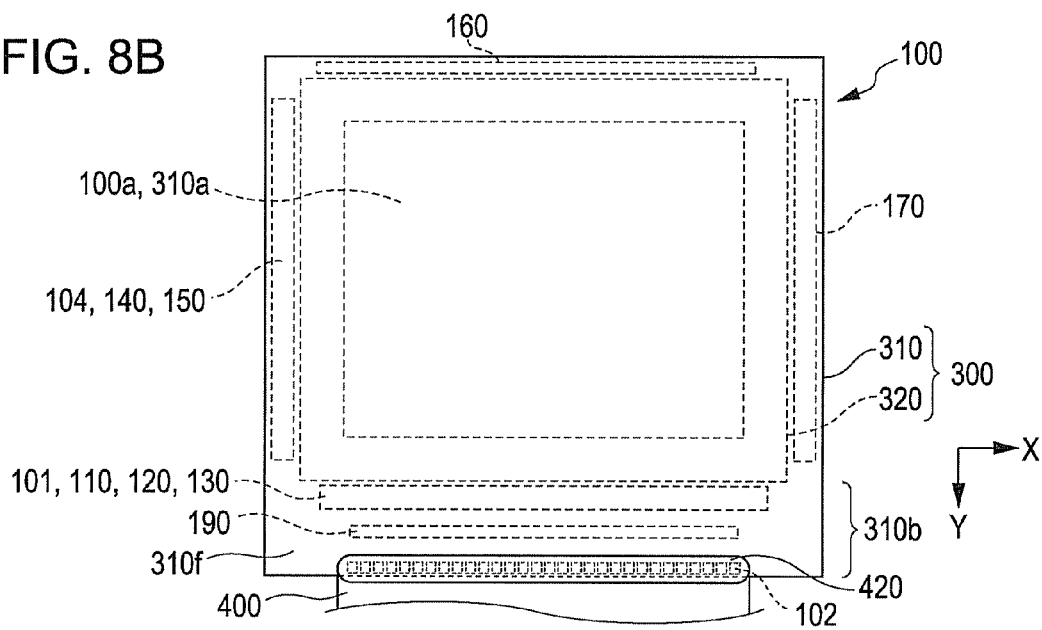
FIG. 8B is a bottom view of the modification.
Figure 8C:
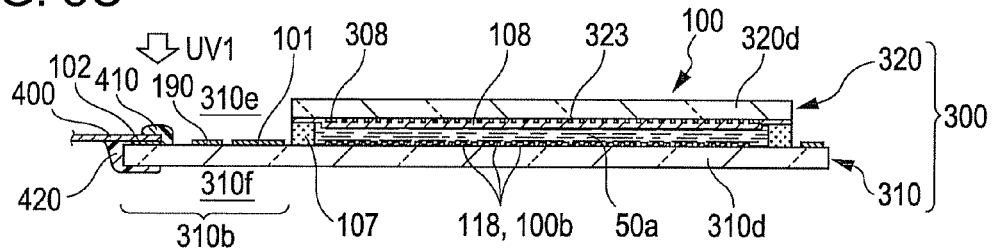
FIG. 8C is a sectional view of the modification along the line VIIIC-VIIIC of FIG. 8A.

In this embodiment, no reinforcing member for reinforcing the connecting portion between the element substrate 310 and the flexible printed circuit board 400 is provided on the second surface 310f of the element substrate 310. However, a molding member, made of a material other than a UV-curable material, for reinforcement may be provided on the second surface 310f of the element substrate 310 as shown in FIGS. 8A, 8B, 8C, 9A, 9B, and 9C. With reference to FIGS. 8A, 8B, and 8C, in order to reinforce the connecting portion between the element substrate 310 and the flexible printed circuit board 400, a second molding member 420 is disposed on the second surface 310f of the element substrate 310 so as to extend from the element substrate 310 to the flexible printed circuit board 400 in addition to the first molding member 410, which is disposed on the first surface 310e of the element substrate 310 so as to extend from the element substrate 310 to the flexible printed circuit board 400.

The second molding member 420 is not made of any UV-curable resin but is made of a room-temperature-curable silicone resin. The first surface 310e of the element substrate 310 is irradiated with UV light such that the first molding member 410 is cured; however, the second surface 310f of the element substrate 310 is not irradiated with UV light. That is, UV light is incident on first diode elements 41 and second diode elements 42 included in the electrostatic protection circuit 190 once when UV light is applied to the first surface 310e of the element substrate 310, although the electrostatic protection circuit 190 is adjacent to a region containing the connection terminals 102. The second molding member 420, which is disposed on the second surface 310f of the element substrate 310, may be made of a heat-curable resin such as an epoxy resin instead of the room-temperature-curable silicone resin.

Figure 9A:
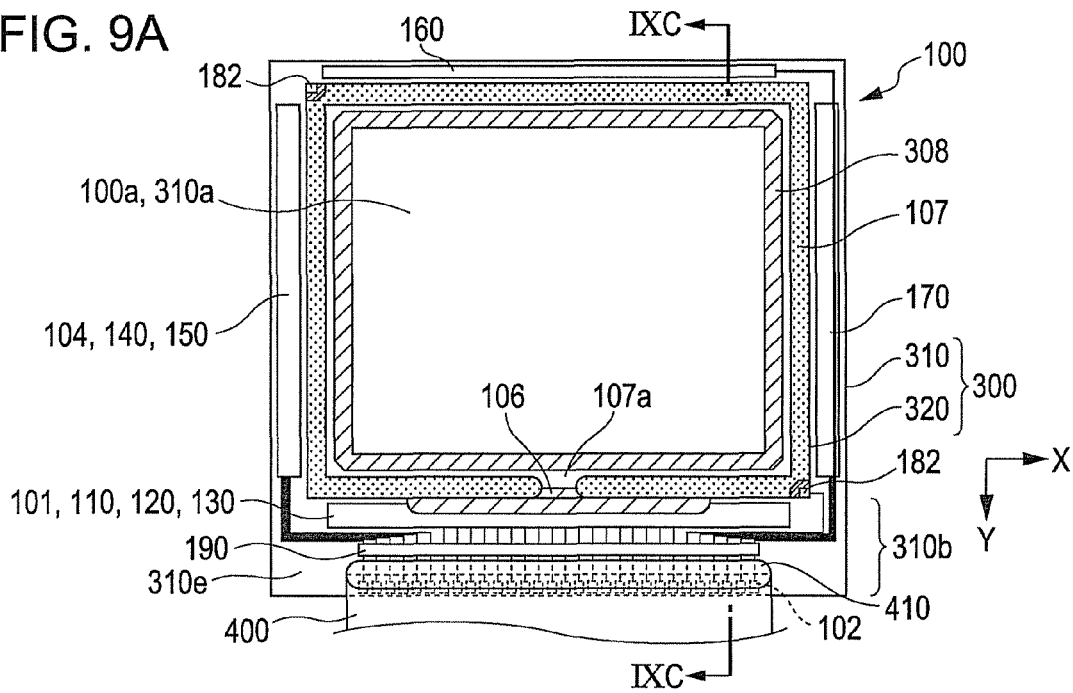
FIG. 9A is a plan view of another modification of the electro-optical device according to the second embodiment.
Figure 9B:
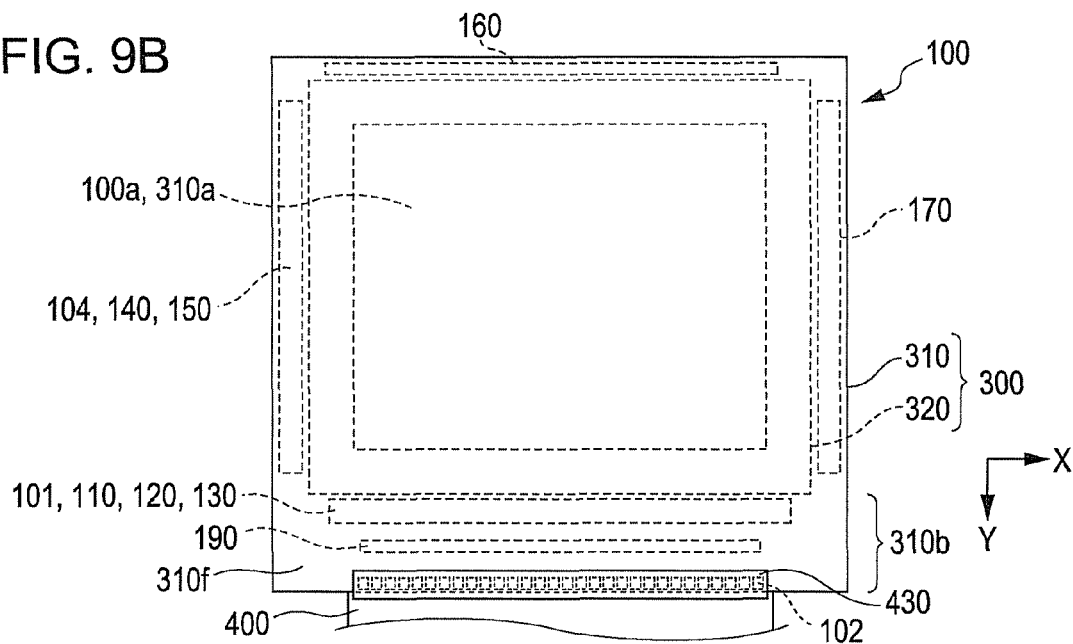
FIG. 9B is a bottom view of this modification.
Figure 9C:
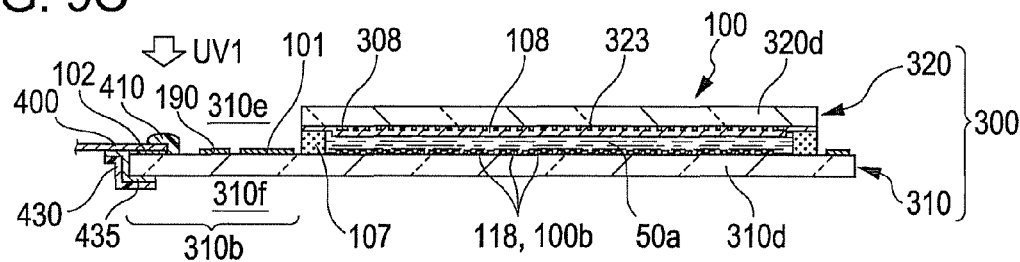
FIG. 9C is a sectional view of this modification taken along the line IXC-IXC of FIG. 9A.

Alternatively, as shown in FIGS. 9A, 9B, and 9C, a sheet-shaped reinforcing member 430 may be provided on the second surface 310f of the element substrate 310 so as to extend from the element substrate 310 to the flexible printed circuit board 400 such that the connecting portion between the element substrate 310 and the flexible printed circuit board 400 is reinforced, instead of the second molding member 420 shown in FIGS. 8A, 8B, and 8C. The sheet-shaped reinforcing member 430 is bonded to the element substrate 310 with an adhesive member 435. Examples of the sheet-shaped reinforcing member 430 include plastic films, metal sheets, and laminate films including metal layers and plastic layers.

Third Embodiment

FIG. 10A is a plan view of an electro-optical device 100 according to a third embodiment of the present invention. FIG. 10B is a bottom view of the electro-optical device 100. FIG. 10C is a sectional view of the electro-optical device 100 taken along the line XC-XC of FIG. 10A. The spatial relationships of members shown in FIG. 10B agree with those of the members shown in FIG. 10A. The configuration of the electro-optical device 100 is the same as that described in the first embodiment with reference to FIGS. 1A to 1C and therefore will not be described in detail.

The electrical configuration and operation of the electro-optical device 100 is the same as those described in the first embodiment with reference to FIGS. 2 and 3 and therefore will not be described in detail. The configuration of an element substrate 310 is the same as that described in the first embodiment with reference to FIG. 4 and therefore will not be described in detail. The configuration of an electrostatic protection circuit 190 is the same as that described in the first embodiment with reference to FIG. 5 and therefore will not be described in detail.

Method for Manufacturing Electro-Optical Device 100 and Principal Advantages of this Embodiment The manufacture of the electro-optical device 100 starts with the preparation of a liquid crystal panel 300 shown in FIGS. 10A, 10B, and 10C. A flexible printed circuit board 400 is then connected to connection terminals 102, arranged on the element substrate 310, with an anisotropic conductive material.

The element substrate 310 has a first surface 310e (an inside surface opposed to a counter substrate 320) having pixel electrodes 118 arranged thereon and also has a second surface 310f (an outside surface opposed to the first surface 310e). A first molding member 410 made of a UV curable material such as an acrylic resin is provided on the first surface 310e so as to extend from the element substrate 310 to the flexible printed circuit board 400. UV light is applied to the first surface 310e of the element substrate 310 as indicated by Arrow UV1, whereby the first molding member 410 is cured. On the other hand, no UV-curable molding member for reinforcement is provided on the second surface 310f of the element substrate 310.

In this embodiment, in order to reinforce a connecting portion between the element substrate 310 and the first molding member 410, the first molding member 410 is provided on the first surface 310e of the element substrate 310 so as to extend from the element substrate 310 to the flexible printed circuit board 400; however, no UV-curable molding member for reinforcement is provided on the second surface 310f of the element substrate 310. Therefore, the first surface 310e of the element substrate 310 is irradiated with UV light but the second surface 310f of the element substrate 310 is not irradiated with UV light. Therefore, UV light is incident on first diode elements 41 and second diode elements 42 included in the electrostatic protection circuit 190 once when UV light is applied to the first surface 310e of the element substrate 310, although the electrostatic protection circuit 190 is adjacent to a region containing the connection terminals 102. Hence, current-voltage properties of the first and second diode elements 41 and 42 are not varied or are only slightly varied. This prevents currents from leaking from the first and second diode elements 41 and 42. Hence, the presence of the electrostatic protection circuit 190 does not lead to an increase in powder consumption.

Pixels 100b included in the electro-optical device 100 each include a memory circuit 30; hence, the electro-optical device 100 has low powder consumption. If current-voltage properties of the first and second diode elements 41 and 42 are varied by the irradiation with UV light and therefore the powder consumption of the electro-optical device 100 is increased, the memory circuits 30 will lose the reason for their existence. However, according to this embodiment, the following object can be achieved: an object that the power consumption of the electro-optical device 100 is reduced by providing the memory circuits 30 in the pixels 100b.

The first molding member 410 is preferably spaced from the electrostatic protection circuit 190 at a distance of 1 mm or more in the in-plane direction of the element substrate 310, the distance therebetween being represented by d1 in FIG. 10C. This prevents the first and second diode elements 41 and 42 of the electrostatic protection circuit 190 from being directly irradiated with UV light when UV light is applied to the first surface 310e of the element substrate 310 such that the first molding member 410 is cured.

In this embodiment, no reinforcing member for reinforcing the connecting portion between the element substrate 310 and the flexible printed circuit board 400 is provided on the second surface 310f of the element substrate 310. However, a molding member, made of a material other than a UV-curable material, for reinforcement may be provided on the second surface 310f of the element substrate 310 as shown in FIGS. 11A, 11B, 11C, 12A, 12B, and 12C. With reference to FIGS. 11A, 11B, and 11C, a second molding member 420 is disposed on the second surface 310f of the element substrate 310 so as to extend from the element substrate 310 to the flexible printed circuit board 400 in addition to the first molding member 410, which is disposed on the first surface 310e of the element substrate 310 so as to extend from the element substrate 310 to the flexible printed circuit board 400 and is used to reinforce the connecting portion between the element substrate 310 and the flexible printed circuit board 400.

The second molding member 420 is not made of any UV-curable resin but is made of a room-temperature-curable silicone resin. Therefore, the first surface 310e of the element substrate 310 is irradiated with UV light such that the first molding member 410 is cured; however, the second surface 310f of the element substrate 310 is not irradiated with UV light. That is, UV light is incident on first diode elements 41 and second diode elements 42 included in the electrostatic protection circuit 190 once when UV light is applied to the first surface 310e of the element substrate 310, although the electrostatic protection circuit 190 is adjacent to a region containing the connection terminals 102. The second molding member 420, which is disposed on the second surface 310f of the element substrate 310, may be made of a heat-curable resin such as an epoxy resin instead of the room-temperature-curable silicone resin.

Figure 12A:
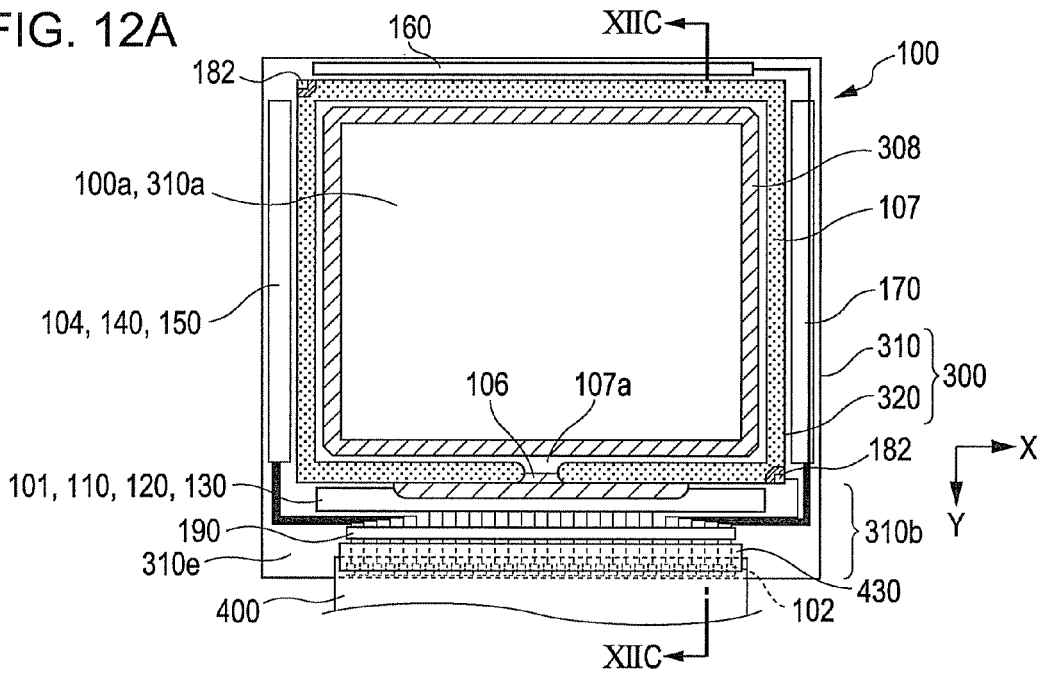
FIG. 12A is a plan view of another modification of the electro-optical device according to the third embodiment.
Figure 12B:
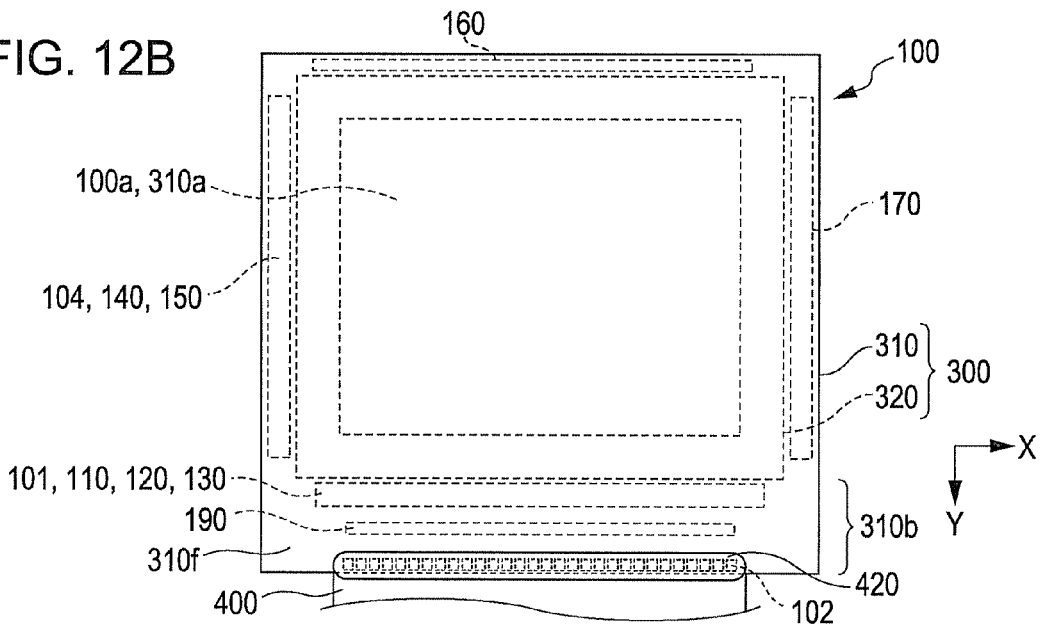
FIG. 12B is a bottom view of this modification.
Figure 12C:
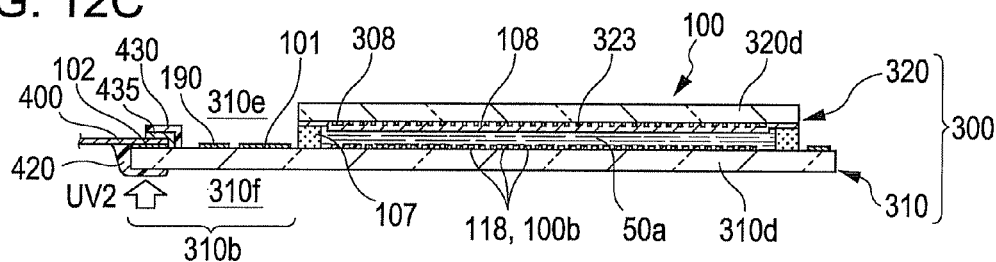
FIG. 12C is a sectional view of this modification along the line XIIC-XIIC of FIG. 12A.

Alternatively, as shown in FIGS. 12A, 12B, and 12C, a sheet-shaped reinforcing member 430 may be provided on the second surface 310f of the element substrate 310 so as to extend from the element substrate 310 to the flexible printed circuit board 400 such that the connecting portion between the element substrate 310 and the flexible printed circuit board 400 is reinforced, instead of the second molding member 420 shown in FIGS. 11A, 11B, and 11C. The sheet-shaped reinforcing member 430 is bonded to the element substrate 310 with an adhesive member 435. Examples of the sheet-shaped reinforcing member 430 include plastic films, metal sheets, and laminate films including metal layers and plastic layers.

Fourth Embodiment

FIG. 13A is a plan view of an electro-optical device 100 according to a fourth embodiment of the present invention. FIG. 13B is a bottom view of the electro-optical device 100. FIG. 13C is a sectional view of the electro-optical device 100 taken along the line XIIC-XIIC of FIG. 13A. The spatial relationships of members shown in FIG. 13B agree with those of the members shown in FIG. 13A. The configuration of the electro-optical device 100 is the same as that described in the first embodiment with reference to FIGS. 1A to 1C and therefore will not be described in detail.

The electrical configuration and operation of the electro-optical device 100 is the same as those described in the first embodiment with reference to FIGS. 2 and 3 and therefore will not be described in detail. The configuration of an element substrate 310 is the same as that described in the first embodiment with reference to FIG. 4 and therefore will not be described in detail. The configuration of an electrostatic protection circuit 190 is the same as that described in the first embodiment with reference to FIG. 5 and therefore will not be described in detail.

Method for Manufacturing Electro-Optical Device 100 and Principal Advantages of this Embodiment The manufacture of the electro-optical device 100 starts with the preparation of a liquid crystal panel 300 shown in FIGS. 10A, 10B, and 10C. A flexible printed circuit board 400 is then connected to connection terminals 102, arranged on the element substrate 310, with an anisotropic conductive material.

The element substrate 310 has a first surface (an inside surface opposed to a counter substrate 320) having pixel electrodes 118 arranged thereon. A first molding member 410 made of a UV curable material such as an acrylic resin is provided on the first surface so as to extend from the element substrate 310 to the flexible printed circuit board 400. UV light is applied to the first surface of the element substrate 310 as indicated by Arrow UV1, whereby the first molding member 410 is cured.

The element substrate 310 also has a second surface (an outside surface opposed to the first surface) opposed to the first surface. A second molding member 420 made of a UV curable material such as an acrylic resin is provided on the second surface so as to extend from the element substrate 310 to the flexible printed circuit board 400. UV light is applied to the second surface of the element substrate 310 as indicated by Arrow UV2, whereby the second molding member 420 is cured.

In the element substrate 310, the electrostatic protection circuit 190 is adjacent to a region containing the connection terminals 102. The first molding member 410 is preferably spaced from the electrostatic protection circuit 190 at a distance of 1 mm or more in the in-plane direction of the element substrate 310, the distance therebetween being represented by d1 in FIG. 13C. This prevents the first and second diode elements 41 and 42 of the electrostatic protection circuit 190 from being directly irradiated with UV light when UV light is applied to the first surface of the element substrate 310 as indicated by Arrow UV1 such that the first molding member 410 is cured.

The second molding member 420 is preferably spaced from the electrostatic protection circuit 190 at a distance of 1 mm or more in the in-plane direction of the element substrate 310, the distance therebetween being represented by d2 in FIG. 13C. This prevents the first and second diode elements 41 and 42 of the electrostatic protection circuit 190 from being directly irradiated with UV light passing through the element substrate 310 when UV light is applied to the second surface of the element substrate 310 as indicated by Arrow UV2 such that the second molding member 420 is cured.

In the operation of curing the first and second molding members 410 and 420, the electrostatic protection circuit 190 is shielded from UV light and therefore current-voltage properties of the first and second diode elements 41 and 42, which are included in the electrostatic protection circuit 190, are not varied. This prevents unnecessary currents from flowing through the first and second diode elements 41 and 42. Hence, the presence of the electrostatic protection circuit 190 does not lead to an increase in powder consumption.

In this embodiment, pixels 100b included in the electro-optical device 100 each include a memory circuit 30; hence, the electro-optical device 100 has low powder consumption. If current-voltage properties of the first and second diode elements 41 and 42 are varied by the irradiation with UV light and therefore the powder consumption of the electro-optical device 100 is increased, the memory circuits 30 will lose the reason for their existence. However, according to this embodiment, the following object can be achieved: an object that the power consumption of the electro-optical device 100 is reduced by providing the memory circuits 30 in the pixels 100b.

Figure 14A:
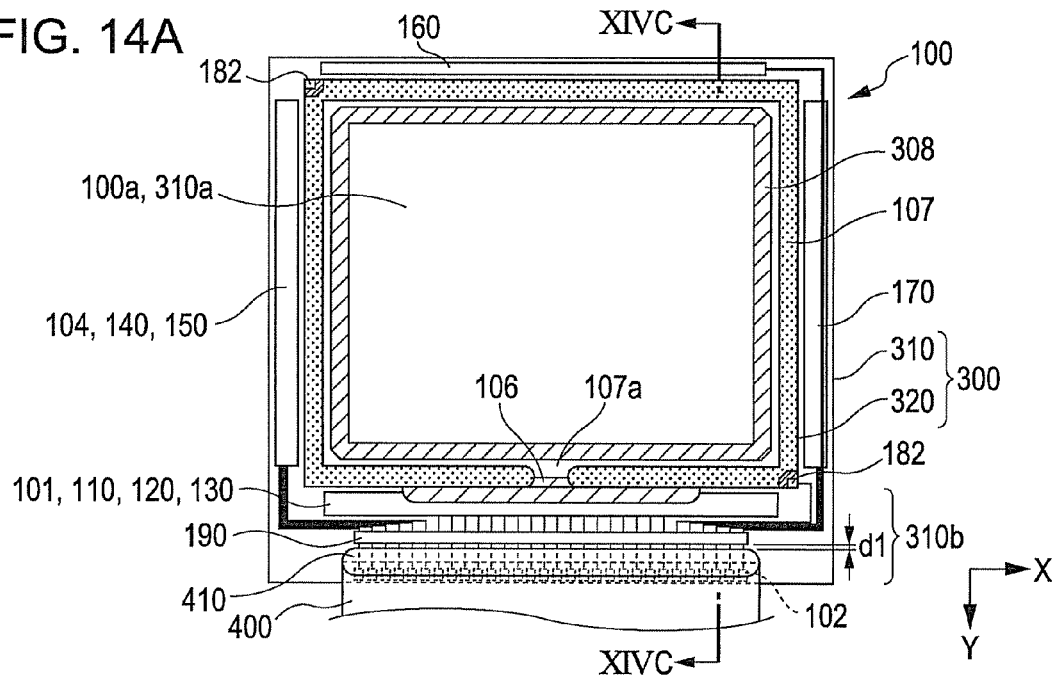
FIG. 14A is a plan view of a modification of the electro-optical device according to the fourth embodiment of the present invention.
Figure 14B:
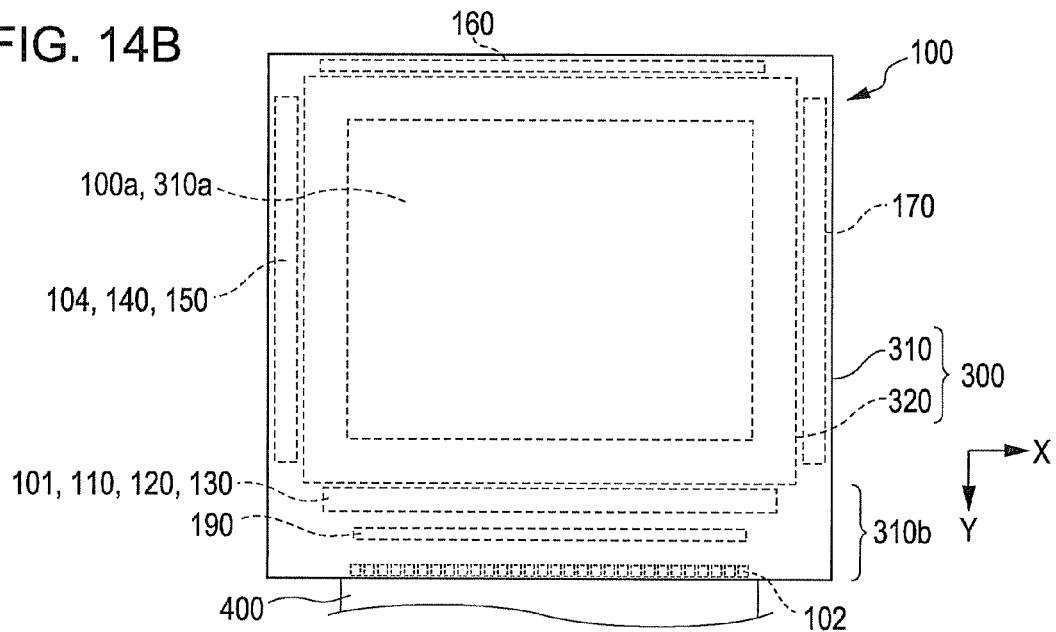
FIG. 14B is a bottom view of this modification.
Figure 14C:
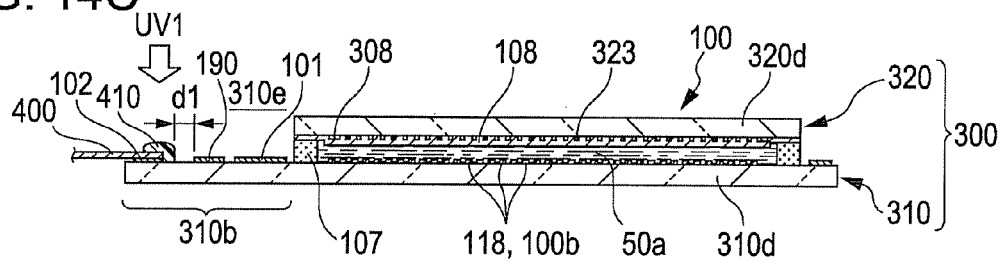
FIG. 14C is a sectional view of this modification taken along the line XIVC-XIVC of FIG. 14A.

As shown in FIGS. 14A, 14B, and 14C, a first molding member 410 made of a UV-curable resin such as an acrylic resin is disposed on a first surface of an element substrate 310 so as to extend from this element substrate 310 to a flexible printed circuit board 400. Pixel electrodes 118 are arranged on the first surface thereof. This first molding member 410 is preferably spaced from an electrostatic protection circuit 190 at a distance of 1 mm or more in the in-plane direction of this element substrate 310, the distance therebetween being represented by d1 in FIG. 14C.

In this configuration, when UV light is applied to the first surface of this element substrate 310 as indicated by Arrow UV1 such that this first molding member 410 is cured, first diode elements 41 and second diode elements 42 included in this electrostatic protection circuit 190 are prevented from being directly irradiated with UV light independently of whether this element substrate 310 is light-transmissive or not. When this element substrate 310 is not light-transmissive, a second molding member 420 made of a UV-curable resin such as an acrylic resin may be disposed on a second surface of this element substrate 310. This second molding member 420 may be spaced from this electrostatic protection circuit 190 at a distance of less than 1 mm in the in-plane direction of this element substrate 310, the distance therebetween being represented by d2 in FIG. 14C.

Figure 15A:
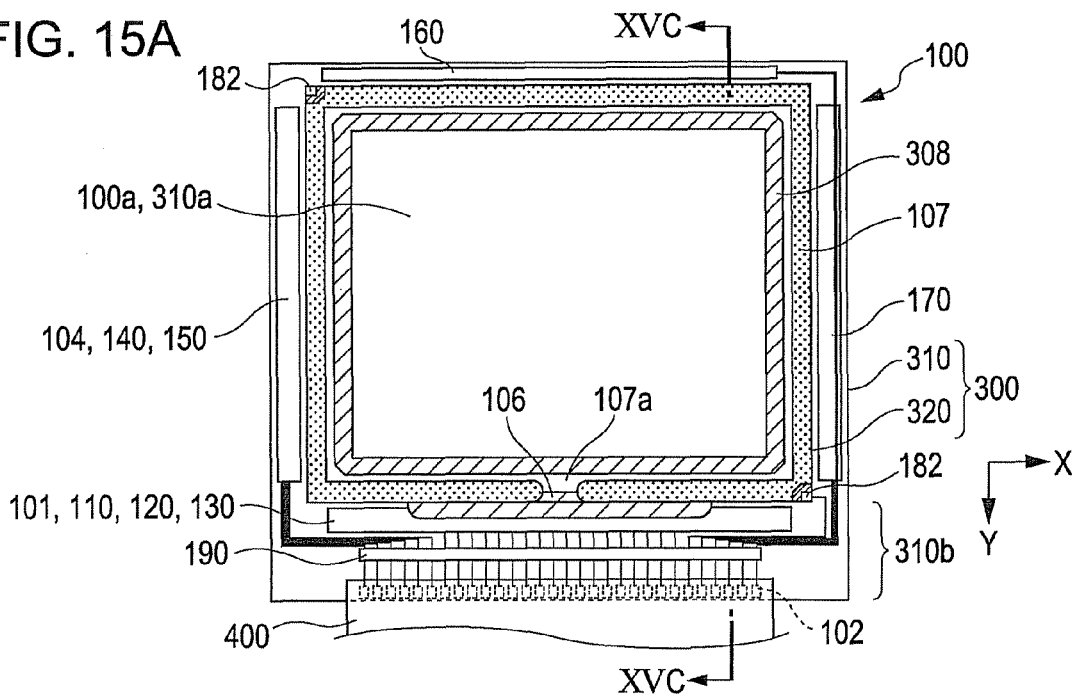
FIG. 15A is a plan view of another modification of the electro-optical device according to the fourth embodiment of the present invention.
Figure 15B:
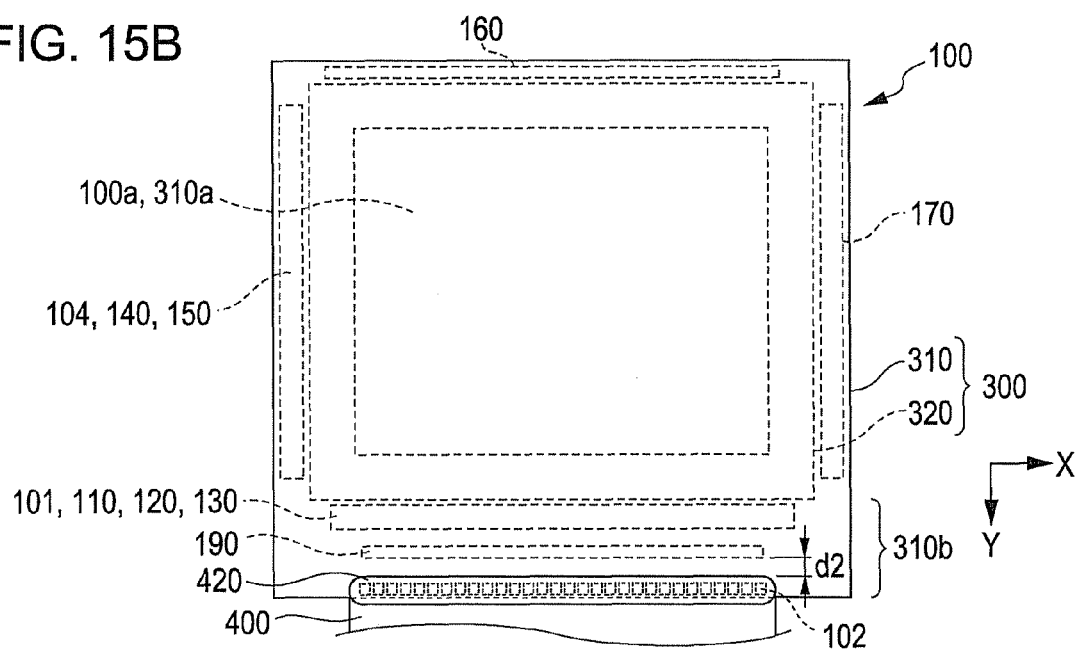
FIG. 15B is a bottom view of this modification.
Figure 15C:
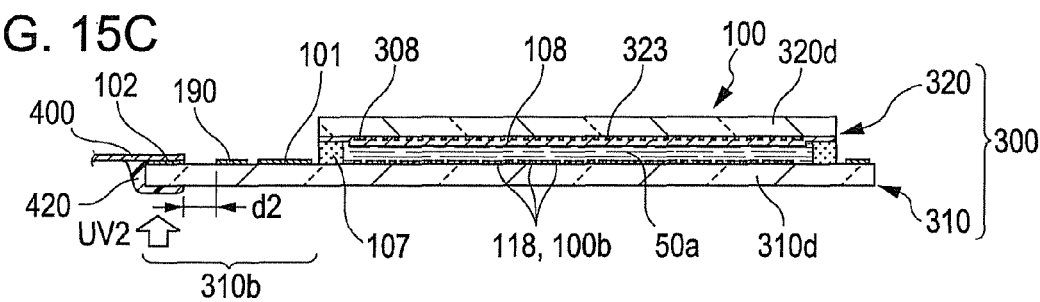
FIG. 15C is a sectional view of this modification taken along the line XVC-XVC of FIG. 15A.

Alternatively, as shown in FIGS. 15A, 15B, and 15C, a second molding member 420 made of a UV-curable resin such as an acrylic resin is disposed on a first surface of an element substrate 310 so as to extend from this element substrate 310 to a flexible printed circuit board 400. Pixel electrodes 118 are arranged on the first surface thereof. This second molding member 420 is preferably spaced from an electrostatic protection circuit 190 at a distance of 1 mm or more in the in-plane direction of this element substrate 310, the distance therebetween being represented by d2 in FIG. 15C. This configuration is employed when this element substrate 310 is light-transmissive. In this configuration, when UV light is applied to the second surface of this element substrate 310 as indicated by Arrow UV2 such that this second molding member 420 is cured, first diode elements 41 and second diode elements 42 included in this electrostatic protection circuit 190 are prevented from being directly irradiated with UV light.

Modifications

The electro-optical devices 100 according to the first to fourth embodiments include the circuits described with reference to FIGS. 2A, 2B, 3A, 3B, and 4. An electro-optical device 100 may include pixels 100b including additional memory circuits. Alternatively, an electro-optical device 100 may include pixels 100b including no memory circuits. The present invention is effective in reducing the powder consumption of these electro-optical devices 100.

The electro-optical devices 100 according to the first to fourth embodiments are of a transmissive type as described above. The electro-optical devices 100 may be of a reflective or transflective type. In this case, the element substrate 310 or counter substrate 320 of each electro-optical device 100 includes a light-reflecting layer. The light-reflecting layer may overlap with the electrostatic protection circuit 190 of the electro-optical device 100 such that the electrostatic protection circuit 190 is prevented from being irradiated with UV light when the sealing member 107 of the electro-optical device 100 is formed. In the case where the electro-optical device 100 is used as a reflective liquid crystal device, the element substrate 310 may include a single-crystalline silicon plate. Alternatively, the element substrate 310 or the counter substrate 320 may each include a rigid plate such as a glass plate, a quartz plate, or a single-crystalline silicon plate; a flexible plate prepared by thinning the rigid plate; or another flexible plate such as plastic plate.

The electro-optical devices 100 according to the first to fourth embodiments include the TN liquid crystal as described above and may include an STN liquid crystal or a guest-host liquid crystal material. The guest-host liquid crystal material is prepared in such a manner that a dye (a guest) having such an optical anisotropy that the absorbance of visible light depends on the longitudinal direction and lateral direction of molecules of the dye is dissolved in a liquid crystal having a certain molecular arrangement such that the dye molecules are arranged in parallel to molecules of the liquid crystal. Alternatively, the electro-optical devices 100 may include a homeotropic liquid crystal of which molecules are aligned perpendicularly to both substrates during the application of a voltage to the homeotropic liquid crystal and are aligned in parallel to both substrates during the application of no voltage thereto. The electro-optical devices 100 may serve as liquid crystal devices operating in an in-plane switching (IPS) mode or a fringe field switching (FFS) mode. In this case, in each electro-optical device 100, the common electrode 108 as well as the pixel electrodes 118 is included in the element substrate 310.

The electro-optical devices 100 according to the first to fourth embodiments serve as liquid crystal devices as described above and may serve as electro-optical systems including organic electroluminescent (EL) elements, electrophoretic elements, electron-emitting elements, or plasma display elements.

Fifth Embodiment

Figure 16A:
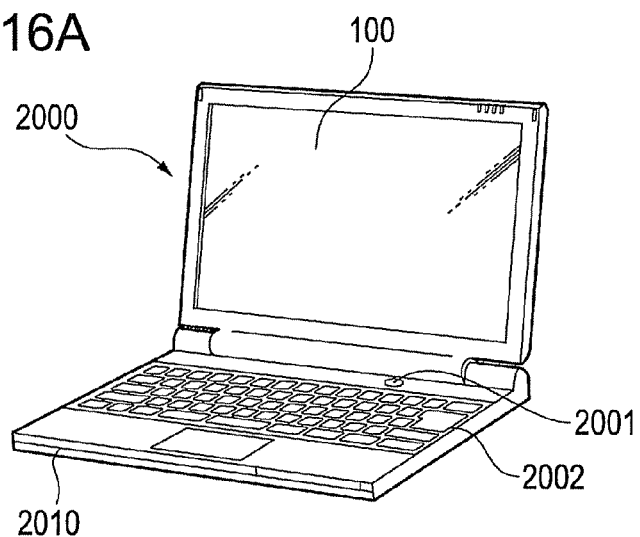
FIG. 16A is an illustration of a mobile personal computer including the electro-optical device according to any one of the first to fourth embodiment.
Figure 16B:
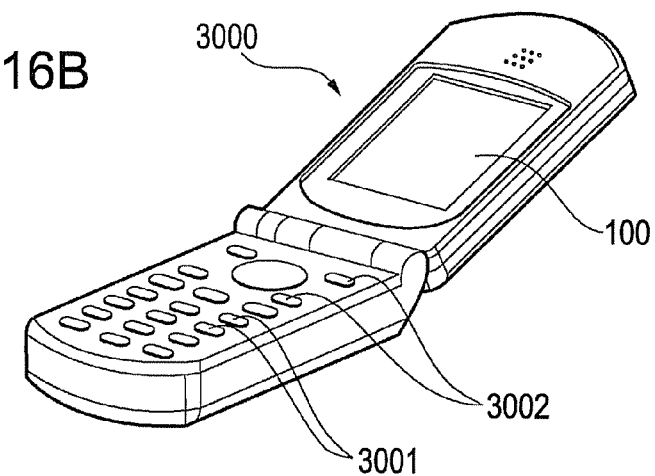
FIG. 16B is an illustration of a mobile phone including the electro-optical device according to any one of the first to fourth embodiment.
Figure 16C:
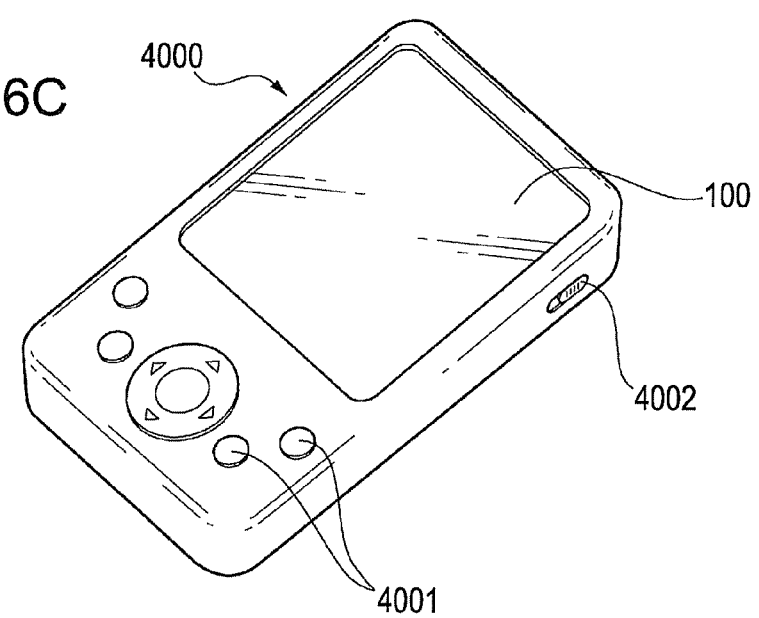
FIG. 16C is an illustration of a personal digital assistant including the electro-optical device according to any one of the first to fourth embodiment.

An electronic apparatus according to a fifth embodiment of the present invention includes the electro-optical device 100 according to any one of the first to fourth embodiment. Examples of the electronic apparatus will now be described. FIG. 16A shows a mobile personal computer 2000 including the electro-optical device 100 serving as a display unit and a main body 2010. The main body 2010 includes a power switch 2001 and a keyboard 2002. FIG. 16B shows a mobile phone 3000 including the electro-optical device 100 serving as a display unit, a plurality of operation buttons 3001, and a plurality of scroll buttons 3002. An image displayed on the electro-optical device 100 is scrolled by operating the scroll buttons 3002. FIG. 16C shows a personal digital assistant (PDA) 4000 including the electro-optical device 100 serving as a display unit, a plurality of operation buttons 4001, and a power switch 4002. Various data such as address data or schedule data are displayed on the electro-optical device 100 by turning the power switch 4002 on.

Examples of the electronic apparatus, which includes the electro-optical device 100, include digital still cameras, liquid crystal televisions, viewfinder-type or direct view-type video tape recorders, car navigation systems, pagers, electronic notebooks, portable electronic calculators, word processors, work stations, video phones, point-of-sale (POS) terminals, and touch panel-including apparatuses in addition to the apparatuses shown in FIGS. 16A to 16C. The electro-optical device 100 can be used as a display unit for these electronic apparatuses. The electro-optical device 100 may be used as a light valve for projection display systems.

The entire disclosure of Japanese Patent Application Nos 2007-068076, filed Mar. 16, 2007, 2007-068077, filed Mar. 16, 2007, 2007-068078, filed Mar. 16, 2007, 2007-068082, filed Mar. 16, 2007 and 2007-197022, filed Jul. 30, 2007 are expressly incorporated by reference herein.

What is claimed is:

1. A method for manufacturing an electro-optical device, comprising:
    providing a display device including an element substrate and a counter substrate, an area overlapped by both the element substrate and the counter substrate including a plurality of pixels including pixel electrodes that define a display area, the element substrate having a portion extending outward from the area overlapped by both the element substrate and the counter substrate that is connected to a circuit board;
    providing a UV-curable molding member on the portion of the element substrate such that the molding member overlaps the element substrate and the circuit board; and
    curing the molding member by irradiating the molding member with UV light,
    wherein the portion of the element substrate includes an electrostatic protection circuit and the electrostatic protection circuit is shielded by a light-shielding sheet that is separate and apart from the electro-optical device, the light-shielding sheet shielding the electrostatic protection circuit from the UV light applied to the molding member during curing of the molding member.

2. The method according to claim 1, wherein the electro-optical device includes memory elements each corresponding to one of the pixels.

3. The method according to claim 1, wherein the molding member is provided on the element substrate such that the molding member is spaced from the electrostatic protection circuit at a distance of 1 mm or more.

4. The method according to claim 1, wherein the element substrate has a first surface having the pixel electrodes arranged thereon and a second surface opposed to the first surface, the first surface is connected to the circuit board in the operation of connecting the element substrate to the circuit board, and the molding member is provided on one of the first and second surfaces in the operation of providing the molding member on the element substrate.

5. The method according to claim 4, wherein the molding member is provided on one of the first and second surfaces in the operation of providing the molding member on the element substrate, another UV-curable molding member is provided on the other one of the first and second surfaces, the first and second surfaces are irradiated with UV light in the operation of curing the molding member, the electrostatic protection circuit is shielded from both the UV light applied to the first surface and the UV light applied to the second surface.

6. The method of claim 1, wherein the electrostatic circuit is completely shielded from the UV light during curing of the molding member.

7. The method of claim 1, wherein the electrostatic circuit is entirely shielded from the UV light during curing of the molding member to prevent current leakage from the electrostatic circuit.

8. The method of claim 7, wherein the electrostatic circuit includes diode elements, and shielding the electrostatic circuit from the UV light prevents current leakage from the diode elements.

9. A method for manufacturing an electro-optical device comprising:
    providing an element substrate including a first surface and a second surface, a plurality of pixel electrodes and an electrostatic protection circuit being provided on the first surface;
    providing a circuit board;
    disposing a UV-curable molding member on the element substrate and the circuit board such that the molding member overlaps the element substrate and the circuit board; and
    curing the molding member to fix the element substrate to the circuit board by irradiating the molding member with UV light from both a first surface side and a second surface side of the element substrate,
    wherein during the step of curing the molding member, entirely shielding the electrostatic protection circuit from the UV light being applied to the molding member with a pair of light-shielding sheets that are separate and apart from the electro-optical device, one light-shielding sheet being provided proximate said first surface and another light-shielding sheet being provided proximate said second surface.

10. The method of claim 9, wherein the electrostatic circuit includes at least one diode element that is entirely shielded from the UV light to prevent current leakage from the diode element.

* * * * *